United States Patent
Sato et al.

(10) Patent No.: US 6,246,068 B1
(45) Date of Patent: *Jun. 12, 2001

(54) SEMICONDUCTOR ARTICLE WITH POROUS STRUCTURE

(75) Inventors: Nobuhiko Sato, Yokohama; Takao Yonehara, Atsugi; Kiyofumi Sakaguchi, Yokohama, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/212,432

(22) Filed: Dec. 16, 1998

Related U.S. Application Data

(62) Division of application No. 08/729,722, filed on Oct. 7, 1996, now Pat. No. 5,854,123.

(30) Foreign Application Priority Data

Oct. 6, 1995 (JP) .................................................. 7-260100
Oct. 4, 1996 (JP) .................................................. 8-264386

(51) Int. Cl.$^7$ ........................... H01L 47/00; H01L 27/01; H01L 21/20; H01L 21/36

(52) U.S. Cl. ............................. 257/3; 257/347; 438/478

(58) Field of Search ..................... 257/3, 347; 438/478, 438/507

(56) References Cited

U.S. PATENT DOCUMENTS

| 5,250,460 | 10/1993 | Yamagata et al. | 438/458 |
| 5,278,092 | 1/1994 | Sato | 437/90 |
| 5,278,093 | 1/1994 | Yonehara | 437/109 |

(List continued on next page.)

FOREIGN PATENT DOCUMENTS

| 0553859A2 | 8/1993 | (EP) . |
| 0584777A1 | 3/1994 | (EP) . |
| 0618624A2 | 10/1994 | (EP) . |

(List continued on next page.)

OTHER PUBLICATIONS

Kazuo Imai, "A New Dielectric Isolation Method Using Porous Silicon", Solid–State Electronics, vol. 24, pp. 159–164, Dec. 1981.

C.E. Hunt et al., "Thinning of Bonded Wafers: Etch–Stop Approaches", Extended Abstract of ECS 1st Int'l Symposium of Wafer Bonding, pp. 165–173, Dec. 1991.

A. Uhlir, Jr., "Electrolytic Shaping of Germanium and Silicon" Technical Journal, AT&T Co., N.Y. vol. XXXV, pp. 333–347, Dec. 1956.

(List continued on next page.)

*Primary Examiner*—Mahshid Saadat
*Assistant Examiner*—Allan R. Wilson
(74) *Attorney, Agent, or Firm*—Fitzpatrick, Cella, Harper & Scinto

(57) ABSTRACT

A method is provided for producing, with high reproducibility, an SOI substrate which is flat and high in quality, and simultaneously for achieving resources saving and reduction in cost through recycling of a substrate member. For accomplishing this, a porous-forming step is performed forming a porous Si layer on at least a surface of an Si substrate and a large porosity layer forming step is performed for forming a large porosity layer in the porous Si layer. This large porosity layer forming step is performed by implanting ions into the porous Si layer with a given projection range or by changing current density of anodization in said porous-forming step. At this time, a non-porous single-crystal Si layer is epitaxial-grown on the porous Si layer. Thereafter, the surface of the porous Si layer and a support substrate are bonded together, and then separation is performed at the porous Si layer with the large porosity. Subsequently, selective etching is performed to remove the porous Si layer.

5 Claims, 12 Drawing Sheets

U.S. PATENT DOCUMENTS

| | | | |
|---|---|---|---|
| 5,285,078 | * 2/1994 | Mimura et al. | 257/3 |
| 5,290,712 | 3/1994 | Sato et al. | 437/24 |
| 5,320,907 | 6/1994 | Sato | 428/446 |
| 5,331,180 | * 7/1994 | Yamada et al. | 257/3 |
| 5,363,793 | 11/1994 | Sato | 117/2 |
| 5,371,037 | 12/1994 | Yonehara | 437/86 |
| 5,374,564 | 12/1994 | Bruel | 437/24 |
| 5,403,771 | 4/1995 | Nishida et al. | 437/89 |
| 5,457,058 | 10/1995 | Yonehara | 437/24 |
| 5,644,156 | * 7/1997 | Suzuki et al. | 257/485 |
| 5,856,229 | 1/1999 | Sakaguchi et al. | 438/406 |
| 5,970,361 | 10/1999 | Kumomi et al. | 438/409 |

FOREIGN PATENT DOCUMENTS

| | | |
|---|---|---|
| 2211991 | 12/1989 | (GB) . |
| 62108539A | 5/1987 | (JP) . |
| 03070156A | 3/1991 | (JP) . |
| 5211128 | 8/1993 | (JP) . |
| 07079016 | 3/1995 | (JP) . |
| 07211602B1 | 8/1995 | (JP) . |
| 07302889 | 11/1995 | (JP) . |
| 9545441 | 11/1995 | (JP) . |
| 7-326719 | * 12/1995 | (JP) . |
| 9209104 | 5/1992 | (WO) . |

OTHER PUBLICATIONS

Kazuo Imai et al., "Crystalline Quality of Silicon Layer Formed by FIPOS Technology," Journal of Crystal Growth 63, pp. 547–553, Dec. 1983.

Christine Harendt et al., "Silicon on Insulator Material by Wafer Bonding", Journal of Electronic Materials, vol. 20, No. 3, pp. 267–277, Dec. 1991.

T. Unagami, "Formation Mechanism of Porous Silicon Layer by Anodization in HF Solution", Journal of the Electrochemical Society, vol. 127, No. 1, pp. 476–483, Feb. 1980.

A. Van Veen et al., "Helium–Induced Porous Layer Formation In Silicon", Mat. Res. Soc. Symp. Proc., vol. 107, pp.449–454, Dec. 1988.

V. Raineri and S.U. Campisano, "Silicon–on–insulator produced by helium implantation and thermal oxidation", Appl. Phys. Lett. 66(26), pp. 3654–3656, Jun. 1995.

Nagano, et al., "Oxidized Porous Silicon and It's Application", Engineering Research Report of Institute of Electronics and Communication Engineers of Japan, vol. 79, pp. 49–54, Dec. 1995.

R. P. Holmstrom and J.Y. Chi, "Complete dielectric isolation by highly selective and self–stopping formation of oxidized porous silicon", Appl. Phys. Lett. 42(4), Feb. 1983, pp. 386–388.

* cited by examiner

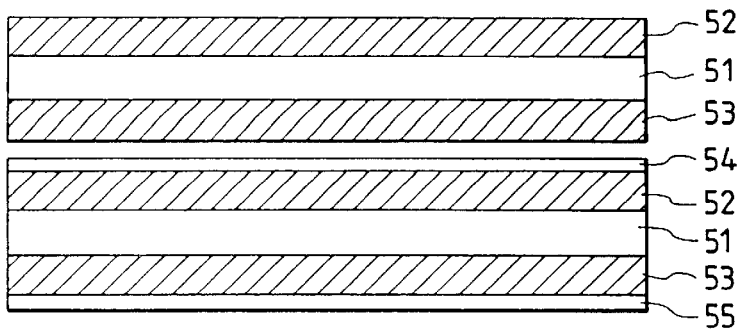
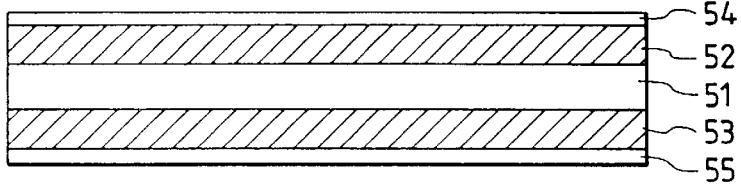
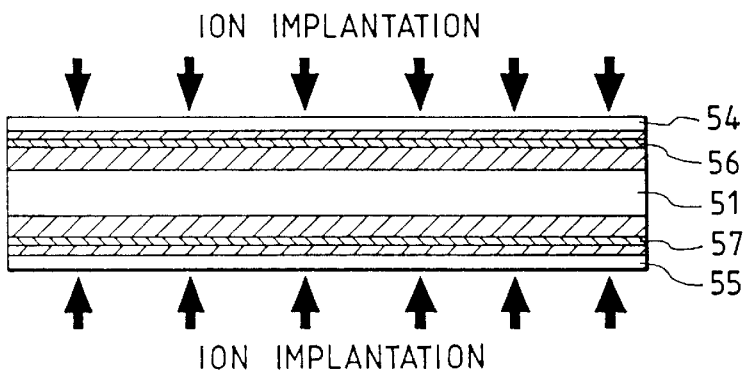
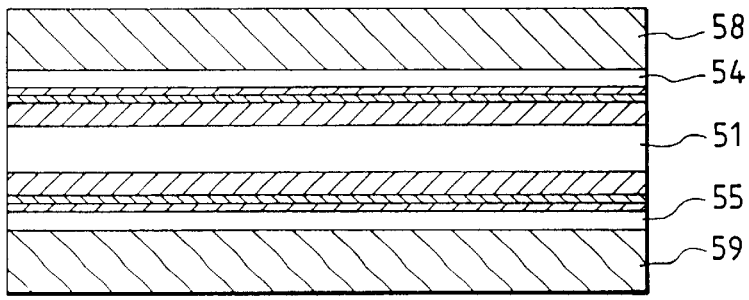
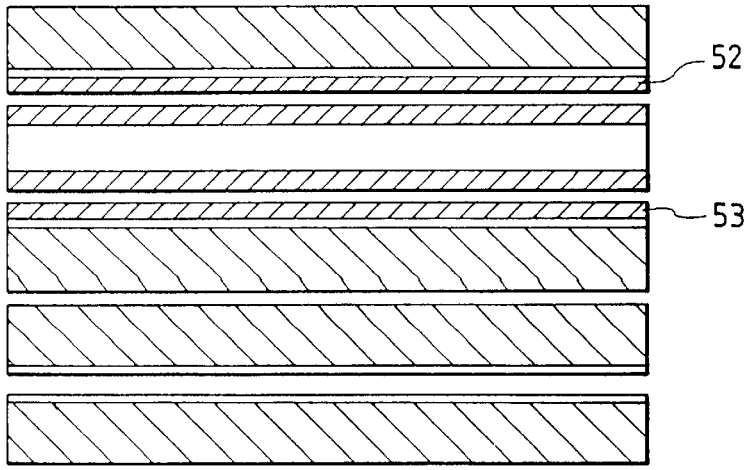
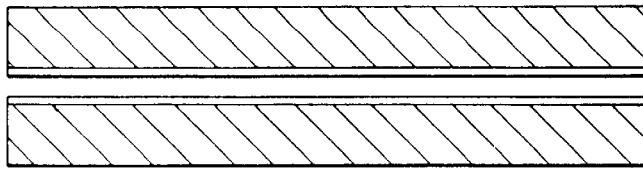

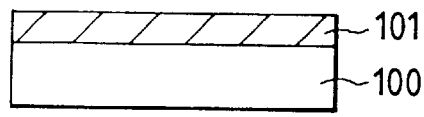
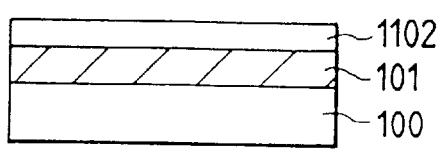
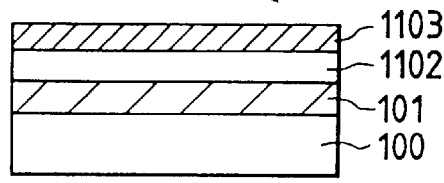
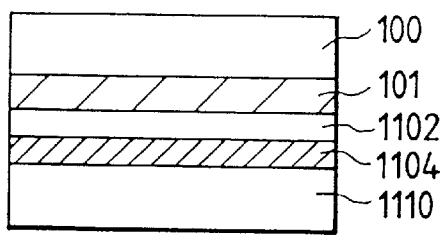
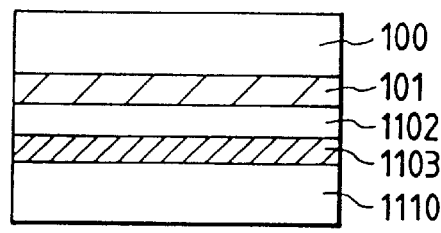
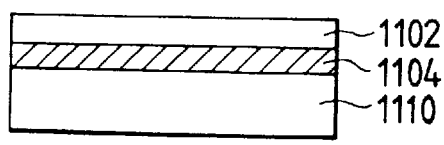
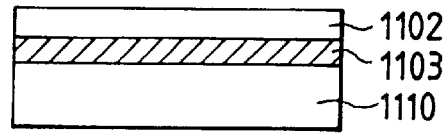

SEMICONDUCTOR ARTICLE WITH POROUS STRUCTURE

BACKGROUND OF THE INVENTION

This is a division of Application No. 08/729,722 filed Oct. 7, 1996, now U.S. Pat. No. 5,854,123 issued Dec. 29, 1998.

FIELD OF THE INVENTION

The present invention relates to a semiconductor substrate and a producing method thereof. More specifically, the present invention relates to dielectric isolation or a producing method of a single-crystal semiconductor on an insulator and a single-crystal compound semiconductor on a Si substrate, and further relates to a method of producing a semiconductor substrate suitable for an electronic device or an integrated circuit formed at a single-crystal semiconductor layer.

RELATED BACKGROUND ART

Formation of a single-crystal Si semiconductor layer on an insulator is widely known as a silicon on insulator SOI. This technique has been extensively researched since a device utilizing the SOI technique has a number of advantages which cannot be achieved by a bulk Si substrate forming the normal Si integrated circuit. Specifically, for example, the following advantages can be achieved by employing the SOI technique:

1. Dielectric isolation is easy and high integration is possible;
2. Radiation resistance is excellent;
3. Floating capacitance is reduced and high speed is possible;
4. Well process can be prevented;
5. Latch-up can be prevented; and
6. Fully depleted (FD) field effect transistor is achieved through film thickness reduction.

These are described in detail, for example, in the literature of Special Issue: "Single-crystal silicon on non-single-crystal insulators"; edited by G. W. Cullen, Journal of Crystal Growth, volume 63, no. 3, pp. 429–590 (1983).

Further, over the past few years, the SOI has been largely reported as a substrate which realizes the acceleration of a MOSFET and low power consumption (IEEE SOI conference 1994). Since an element has an insulating layer at its lower part when employing the SOI structure, an element separation process can be simplified as compared with forming an element on a bulk silicon wafer so that preparing a device can take less time. Specifically, in addition to achieving the higher performance, reduction of the wafer cost and the process cost is expected as compared with a MOSFET or IC on bulk silicon.

Particularly, the fully depleted (FD) MOSFET is expected to achieve higher speed and lower power consumption through improvement in driving force. In general, a threshold voltage (Vth) of a MOSFET is determined by the impurity concentration at a channel portion. On the other hand, in case of the FD MOSFET using the SOI, a depletion layer is also subjected to an influence of a film thickness of the SOI. Thus, for producing the large scale integrated circuits at high yield, uniformity of the SOI thicknesses has been strongly demanded.

On the other hand, a device on a compound semiconductor has high performance, such as, high speed and luminescence, which cannot be achieved by Si. Presently, such a device is normally formed in an epitaxial layer grown on a compound semiconductor substrate, such as a GaAs substrate.

However, there is a problem that the compound semiconductor substrate is expensive while low in mechanical strength, so that a large area wafer is difficult to produce.

Under these circumstances, an attempt has been made to achieve the heteroepitaxial growth of a compound semiconductor on a Si wafer which is inexpensive and high in mechanical strength so that a large area wafer can be produced.

Referring back to the SOI, research on the formation of the SOI substrates has been active since the 1970s. In the beginning, the research was performed in connection with the SOS (sapphire on silicon) method, which achieves the heteroepitaxial growth of single-crystal silicon on a sapphire substrate being an insulator, the FIPOS (fully isolated by porous oxidized silicon) method, which forms the SOI structure by dielectric isolation based on oxidation of porous Si, and the oxygen ion implantation method.

In the FIPOS method, an n-type Si layer is formed on a surface of a p-type Si single-crystal substrate in an island shape through the proton ion implantation (Imai and collaborator, J. Crystal Growth, vol. 63, 547 (1983)) or through the epitaxial growth and the patterning, then only the p-type Si substrate is rendered porous so as to surround the Si island from the surface by means of the anodizing method in a HF solution, and thereafter the n-type Si island is dielectric-isolated through accelerating oxidation. In this method, there is a problem that the isolated Si region is determined in advance of the prepared device so that the degree of freedom of device designing is limited.

The oxygen ion implantation method is a method called SIMOX first reported by K. Izumi. After implanting about $10^{17}$ to $10^{18}/cm^2$ of oxygen ions into a Si wafer, the ion-implanted Si wafer is annealed at the high temperature of about 1,320° C. in the atmosphere of argon/oxygen. As a result, oxygen ions implanted with respect to a depth corresponding to a projection range (Rp) of ion implantation are bonded with silicon so as to form a silicon oxide layer. On this occasion, a silicon layer which has been rendered amorphous at an upper portion of the silicon oxide layer due to the oxygen ion implantation is also recrystallized so as to be a single-crystal silicon layer. Conventionally, there have been a lot of defects included in the silicon layer on the surface, that is, about $10^5/cm^2$. On the other hand, by setting an implantation amount of oxygen to about $4\times10^{17}/cm^2$, defects are successfully reduced to about $10^2/cm^2$. However, since the ranges of implantation energy and implantation amount for maintaining the quality of the silicon oxide layer, the crystalline property of the surface silicon layer and the like are so narrow that thicknesses of the surface silicon layer and the buried silicon oxide (BOX: buried oxide) layer were limited to particular values. For achieving a desired thickness of the surface silicon layer, it was necessary to perform sacrificial oxidation and epitaxial growth. In this case, there is a problem that, since the degradation caused through these processes is superimposed on the distribution of thicknesses, the thickness uniformity deteriorates.

It has been reported that a formation failure region of silicon oxide called a pipe exists in the BOX layer. As one cause of this, the forcing matter upon implantation, such as dust, is considered. In the portion where the pipe exists, the deterioration of the device characteristic results from leaks between an active layer and a support substrate.

Further, since the amount of ion implantation in the SIMOX is large as compared with the ion implantation in the ordinary semiconductor process, implantation time is lengthy even after developing the apparatus to be used exclusively for that process. The ion implantation is performed by raster-scanning an ion beam of a given current amount or expanding the beam so that an increment of the implantation time is predicted following an increment in the area of the wafer. Further, in the high temperature heat treatment of the large-area wafer, it has been pointed out that a problem of occurrence of slip due to the temperature distribution in the wafer becomes more severe. In SIMOX, the heat treatment is essential at high temperature, that is, 1,320° C., which is not normally used in silicon semiconductor processes, so that there has been concern that this problem, including the development of the apparatus, becomes more significant. On the other hand, apart from the foregoing conventional SOI forming method, attention has been recently given to the method which forms the SOI structure by sticking a Si single-crystal substrate to a thermal-oxidized Si single-crystal substrate through heat treatment or using adhesives. In this method, it is necessary to form an active layer for the device into a uniform film. Specifically, it is necessary to form a Si single-crystal substrate of a thickness of as much as hundreds of microns into a film of several microns or less. There are three kinds of methods for thickness reduction as follows:

1. Thickness reduction through polishing;
2. Thickness reduction through local plasma etching;
3. Thickness reduction through selective etching.

In polishing, uniform thickness reduction is difficult. Particularly, in the case of thickness reduction to submicrons, the irregularity amounts to as much as tens of percents so that uniformity is a big problem. If the size of the wafer is further enlarged, the difficulty is increased correspondingly.

In the second method, after reducing the thickness to about 1 to 3 μm through polishing, the thickness distribution is measured at many points. Thereafter, by scanning the plasma using the SF6 of a diameter of several millimeters based on the thickness distribution, etching is performed while correcting the thickness distribution, to reduce the thickness to a given value. In this method, it has been reported that the thickness distribution can be within the range of about ±10 nm. However, if foreign matter (particles) exists on the substrate upon plasma etching, the foreign matter works as an etching mask so that projections are formed on the substrate.

Since the surface is rough immediately after the etching, touch polishing is necessary after completion of the plasma etching. The polishing amount is controlled based on time management, and hence, the control of final film thickness and the deterioration of film thickness distribution due to polishing have been noted. Further, in polishing, abrasives such as colloidal silica directly rub the surface working as an active layer so that there has been concern about formation of a fracture layer due to polishing and introduction of processing distortion. Further, if the wafer is substantially increased in area, since the plasma etching time is increased in proportion to increment of the wafer area, there is concern about extreme reduction of the throughput.

In the third method, a film structure capable of selective etching is formed in advance in a substrate to be formed into a film. For example a p+-Si thin layer containing boron in the concentration no less than $10^{19}/cm^3$ and a $p^-$-Si thin layer are formed on a $p^-$ substrate using the method of, for example, the epitaxial growth to form a first substrate. The first substrate is bonded with a second substrate via an insulating layer such as an oxide film, and then the underside of the first substrate is ground or polished in advance so as to reduce its thickness. Thereafter, the $p^+$ layer is exposed through the selective etching of the $p^-$ layer and further the $p^-$ layer is exposed through the selective etching of the $p^+$ layer, so as to achieve the SOI structure. This method is detailed in the report of Maszara.

Although the selective etching is said to be effective for uniform thickness reduction, it has the following problems:

The ratio of etching selectively is $10^2$ at most, which is not sufficient.

Since surface property after etching is bad, touch polishing is required after etching. However, as a result, the film thickness is reduced and the thickness uniformity tends to deteriorate. Particularly, although the amount of polishing is managed based on time, since dispersion of the polish speed is large, the control of the amount of polishing is difficult. Thus, it becomes a problem particularly in forming an extremely thin SOI layer of, for example, 100 nm.

The crystalline property is bad because of using the ion implantation, the epitaxial growth or the heteroepitaxial growth on the high-concentration B doped Si layer.

The surface property of a surface to be bonded which is inferior to the normal silicon wafer (C. Harenda, et al., J. Elect. Mater. Vol. 20, 267 (1991), H. Baumgart, et al., Extended Abstract of ECS 1st International Symposium of Wafer Bonding, pp. 733 (1991), C. E. Hunt, Extended Abstract of ECS 1st International Symposium of Wafer Bonding, pp. 696 (1991)). Further, the selectivity of selective etching largely depends upon a difference in concentration of impurities such as boron and sharpness of the profile in the depth direction. Accordingly, if the high-temperature bonding annealing for increasing the bonding strength or the high-temperature epitaxial growth for improving the crystalline property is performed, the depth direction distribution of the impurity concentration expands so that the selectivity of etching deteriorates. That is, it is difficult to improve both the ratio of etching selectively and the crystalline property or the bonding strength.

Recently, in view of the foregoing problems, Yonehara and collaborators have reported the bonded SOI which is excellent in thickness uniformity and crystalline property and capable of batch processing. Brief explanation about this will be given using FIGS. 6A to 6E. In this method, a porous layer 62 formed on an Si substrate 61 is used as a material for selective etching (FIG. 6A). After epitaxially growing a non-porous single-crystal Si layer 63 on the porous layer 62 (FIG. 6B), the three-layer composite is bonded with a support substrate 64 via the oxidized Si layer 63 (FIG. 6C). The Si substrate 61 is reduced in thickness through grinding or the like from the underside so as to expose the porous Si 62 all over the substrate (FIG. 6D). The exposed porous Si 62 is removed through etching using a selective etching liquid, such as, KOH or $HF+H_2O_2$ (FIG. 6E). At this time, since the ratio of etching selectively porous Si relative to bulk Si (non-porous single-crystal silicon) can be set fully high, that is, 100,000 times, the non-porous single-crystal silicon layer grown on the porous layer in advance can be left on the support substrate without being hardly reduced in thickness, so as to form the SOI substrate. Accordingly, the thickness uniformity of the SOI is substantially determined during the epitaxial growth. since a CVD apparatus used in the normal semiconductor process can be used for the epitaxial growth, according to the report of Sato and collaborator, the thickness uniformity is realized, for example, within 100 nm±2%. Further, the crystalline property of the epitaxial silicon layer is also excellent and has been reported to be $3.5 \times 10^2/cm^2$.

In the conventional method, since the selectivity of etching depends on the difference in impurity concentration and the depth direction profile, the temperature of the heat treatment (bonding, epitaxial growth, oxidation or the like) which expands the concentration distribution is largely limited to approximately no higher than 800° C. On the other hand, in the etching of this method, since the difference in structure between porous and bulk determines the etching speed, the limitation of the heat treatment temperature is small. It has been reported that the heat treatment at about 1,180° C. is possible. For example, it is known that the heat treatment after bonding enhances the bonding strength between the wafers and reduces the number and size of voids generated at the bonded interface. Further, in the etching based on such a structural difference, the particles, even if adhered on porous silicon, do not affect the thickness uniformity.

On the other hand, in general, on a light transmittable substrate, typically glass, the deposited thin Si layer only becomes amorphous or polycrystalline at best, reflecting disorder in crystal structure of the substrate, so that the high-performance device cannot be produced. This is due to the crystal structure of the substrate being amorphous, and thus an excellent single-crystal layer cannot be achieved even by merely depositing the Si layer.

However, the semiconductor substrate obtained through bonding normally requires two wafers one of which is removed, wastefully for the most part, through polishing, etching or the like, so that the finite resources of the earth are wasted.

Accordingly, in the conventional method, the bonded SOI has various problems of controllability, uniformity and economics.

A method is proposed in Japanese Patent Application No. 7-045441 for recycling the first substrate which is wasted in such a bonding method.

In this method, the following method is adopted, in the foregoing bonding and etch-back method using the porous Si, instead of the step for reducing in thickness the first substrate through grinding, etching or the like from the underside so as to expose the porous Si. This will be explained using FIGS. 7A to 7E.

After forming porous a surface layer 72 of an Si substrate 71 (FIG. 7A), a single-crystal Si layer 73 is formed thereon (FIG. 7B). Then, the single-crystal Si layer 73 along with the Si substrate 71 is bonded to a main surface of another Si substrate 74, working as a support substrate, via an insulating layer therebetween (FIG. 7C). Thereafter, the bonded wafers are separated at the porous layer 72 and the porous Si layer 72 exposed on the surface at the side of the Si substrate 74 is selectively removed so that the SOI substrate is formed. Separation of the bonded wafers is performed, for example, a method selected from the following methods that the tensile force or pressure is sufficiently applied to the bonded wafers perpendicularly relative to an in-plane and uniformly over in-plane; that the wave energy such as the ultrasonic wave is applied; that the porous layer is exposed at the wafer end surfaces, the porous Si is etched to some extent, and what is like a razor blade is inserted thereinto; that the porous layer is exposed at the wafer end surfaces and a liquid such as water is impregnated into the porous Si, and the whole bonded wafers are heated or cooled so as to expand the liquid. Alternatively, separation is performed by applying the force to the Si substrate 71 in parallel to the support substrate 74.

Each of these methods is based on the fact that, although the mechanical strength of the porous Si layer 72 differs depending on the porosity, it is considered to be much weaker than the bulk Si. For example, if the porosity is 50%, the mechanical strength can be considered to be half the bulk. Specifically, when a compressive, tensile or shear force is applied to the bonded wafers, the porous Si layer is first ruptured. As the porosity is increased, the porous layer can be ruptured with a weaker force.

However, if the porosity of porous silicon is increased, it is possible that distortion is introduced due to the ratio of bulk silicon relative to the lattice constant being increased so as to increase warpage of the wafer. As a result, the following problems may be raised, that is, the number of void bonding failure regions, called voids is increased upon bonding, the crystal defect density is increased and, in the worst case, cracks are introduced into the epitaxial layer, and slip lines are introduced on the periphery of the wafer due to the influence of thermal distortion upon the epitaxial growth.

When applying the force in the vertical or horizontal direction relative to the surface of the wafer, since the semiconductor substrate is not a fully rigid body but an elastic body, the wafer may be subjected to elastic deformation depending on a supporting fashion of the wafer so that the force escapes and thus is not applied to the porous layer effectively. Similarly, when inserting what is like a razor blade from the wafer end surface, unless the razor blade is fully thin and fully high in rigidity, the yield may be lowered.

Further, if the bonding strength at the bonded interface is weaker as compared with the strength of the porous Si layer or if weak portions exist locally, the two wafers may be separated at the bonded interface so that the initial object cannot be achieved.

Further, since, in any of the methods, the position where separation occurs in the porous layer is not fixed, if the ratio in etching speed between the porous Si and the bulk Si is not sufficient, the epitaxial silicon layer is first etched more or less at a portion where the porous layer remains thin rather than at a portion where the porous layer remains thick. Thus, the thickness uniformity of the SOI layer may deteriorate. Particularly, when the final thickness of the SOI layer is reduced to about 100 nm, the thickness uniformity is deteriorated so that a problem may result when forming the element, such as the fully depleted MOSFET, whose threshold voltage is sensitive to the film thickness.

Japanese Patent Application No. 5-211128 (corresponding to U.S. Pat. No. 5,374,564) discloses a method for producing the SOI. In this method, hydrogen ions are directly implanted into a single-crystal Si substrate, and then the single-crystal Si substrate and a support substrate are bonded together. Finally, the single-crystal Si substrate is separated at a layer where hydrogen ions are implanted, so as to form the SOI. In this met hod, since hydrogen ions are directly implanted into the single-crystal Si substrate which is then separated at the ion-implanted layer, the flatness of the SOI layer is not good. Further, the thickness of the SOI layer is determined by the projection range, so that the degree of freedom of the thickness is low. Further, it is necessary to select an implanting condition satisfying both the layer thickness and the separation, which creates a difficulty in control. Further, in case of aiming at obtaining a thin layer, the thickness of which cannot be determined by the ion implantation, it is necessary to carry out a reducing process in thickness such as grinding and etching, which process is nonselective, so that there is a fear of deteriorating uniformity of the thickness.

In view of the foregoing, a method has been demanded for producing, with high reproducibility, a high quality SOI substrate and whose SOI layer is extremely flat, while simultaneously saving resources and reducing costs through recycling of the wafer.

On the other hand, in general, on a light transmittable substrate, typically glass, the deposited thin Si layer only becomes amorphous or polycrystalline at best, reflecting disorderliness in crystal structure of the substrate, so that a high-performance device cannot be produced. This is due to the crystal structure of the substrate being amorphous, and thus an excellent single-crystal layer cannot be achieved by merely depositing the Si layer.

The light transmittable substrate is important for constituting a contact sensor as being a light-receiving element or a projection-type liquid-crystal image display device. To achieve further densification, higher resolution and increased fineness of picture elements of the sensor or the display device, a high-performance drive element is required. As a result, it is necessary to produce the element on the light transmittable substrate using the single-crystal layer having an excellent crystalline property.

Further, when using the single-crystal layer, reduction in size and acceleration of a chip can be achieved by incorporating a peripheral circuit for driving the picture elements and an image processing circuit into the same substrate having the picture elements.

Specifically, in case of amorphous Si or polycrystalline Si, it is difficult, due to its defective crystal structure, to produce the drive element having the performance which is required or will be required in the future.

On the other hand, to produce the compound semiconductor device, the substrate of the compound semiconductor is essential. However, the compound semiconductor substrate is expensive and further is very difficult to increase in area.

An attempt has been made to achieve the epitaxial growth of the compound semiconductor such as GaAs on the Si substrate. However, due to differences in lattice constant or thermal expansion coefficient, the grown film is poor in crystalline property and thus is very difficult to apply to the device.

Further, an attempt has been made to achieve the epitaxial growth of the compound semiconductor on porous Si to reduce misfit of the lattice. However, due to low thermostability and age deterioration of porous Si, its stability and reliability are poor as the substrate during or after production of the device. However, there is a problem that the compound semiconductor substrate is expensive and low in mechanical strength so that the large-area wafer is difficult to produce.

In view of the foregoing, an attempt has been made to achieve the heteroepitaxial growth of a compound semiconductor on a Si wafer which is inexpensive and high in mechanical strength so that a large-area wafer can be produced.

Recently, attention has been given to porous silicon as a luminescent material for photoluminescence, electroluminescence or the like, and many research reports have been made. In general, the structure of porous silicon largely differs depending on the type (p, n) and the concentration of impurities contained in the silicon. When the p-type impurities are doped, the structure of porous silicon is roughly divided into two kinds depending on whether the impurity concentration is no less than $10^{18}/cm^3$ or no more than $10^{17}/cm^3$. In the former case, the pore walls are relatively thick, that is, form several nanometers to several tens of nanometers, the pore density is about $10^{11}/cm^2$ and the porosity is relatively low. However, it is difficult for this porous silicon to luminescence. On the other hand, in the latter case, as compared with the former case, porous silicon whose pore wall is no more than several nanometers in thickness, whose pore density is greater by one figure order of magnitude and whose porosity exceeds 50%, can be easily formed. Most luminous phenomena, such as photoluminescence, are mainly based on the formation of porous silicon using the latter as a starting material. However, the mechanical strength is low due to the large porosity. Further, since a lattice constant deviation relative to bulk Si is as much as $10^{-3}$ (about $10^{-4}$ in the former case), there has been a problem that, when epitaxial-growing the single-crystal silicon layer on such porous silicon, defects are largely introduced into the epitaxial Si layer and cracks are further introduced thereinto. On the other hand, for utilizing the fine porous structure, which is suitable for a luminescent material, as a luminescent element, it has been desired that the epitaxial Si layer be formed on porous silicon for providing a contact or the MOSFET or the like as a peripheral circuit to be formed on the epitaxial silicon layer.

SUMMARY OF THE INVENTION

The present invention has an object to provide a semiconductor substrate and a forming method thereof which can solve the foregoing various problems by superposing a finer porous structure in a porous layer.

As a result of assiduous efforts made by the present inventors, the following invention has been achieved.

Specifically, a semiconductor substrate of the present invention is characterized by having a porous Si layer at a surface layer of a Si substrate, and a porous Si layer with large porosity existing in a region of the above-mentioned porous Si layer, which region is at a specific depth from the surface of the above-mentioned porous Si layer. In the semiconductor substrate, a non-porous Si portion may exist on the surface of the porous si layer and an electrode may be formed on respective surfaces of the Si substrate and the non-porous Si layer, so that the semiconductor substrate constitutes a luminescent element.

According to a semiconductor substrate of the present invention, for example, a structure can be easily achieved, wherein a porous layer having a fine structure to work as a luminescent material is sandwiched in a porous layer having a high mechanical strength, such as porous silicon formed on a $p^+$-Si substrate. Although the porous layer having such a fine structure differs from bulk Si in lattice constant, by sandwiching it in the large porous Si layer having an intermediate lattice constant, stresses can be relaxed and introduction of cracks or defects can be suppressed. Specifically, since the luminescent layer which can stable in structure can be formed, it is not only serve to form peripheral circuit or wiring, but it is also possible to provide a material which is excellent in long-term stability.

Further, according to a semiconductor substrate of the present invention, an extremely thin porous layer corresponding to a projection range of ion implantation can be formed. Since the pore size of such a porous layer can be set small, that is, no greater than several tens of nanometers, even the small foreign matter contained in gas and exceeding several tens of nanometers in diameter can be removed. Further, a thickness of such a porous layer can be set small, that is, no greater than 20 $\mu$m, the conductance of the gas can be ensured. Specifically, when using it as a filter for particles in the gas, it is possible to produce a filter which can remove the particles greater than several tens of nanometers in diameter and whose pressure loss is small. Further, if high purity Si which is used in the semiconductor process is used as a substrate, there is no worry about contamination from the filter itself.

The present invention includes a method of producing a semiconductor substrate.

Specifically, a method of producing a semiconductor substrate of the present invention comprises a porous-forming step for forming a Si porous substrate and forming a porous Si layer on at least a surface of the Si substrate, and a high-porosity layer forming step for forming a porous Si layer with large porosity in the region at the specific depth from the porous layer in the porous Si layer. The high-porosity layer forming step can be carried out as an ion implanting step for implanting ions into the porous Si layer with a given projection range. It is preferable that the ions comprise at least one kind of noble gas, hydrogen and nitrogen. It is preferable that a non-porous layer forming step is provided for forming a non-porous layer on a surface of the porous Si layer before the ion implanting step. It is preferable that a bonding step is provided for bonding a support substrate on a surface of the non-porous layer after the high-porosity layer forming step and that a separating step is provided for separating the Si substrate into two at the large porosity porous Si layer after the bonding step. It is preferable that the separating step is performed by heat-treating the Si substrate, by pressurizing the Si substrate in a direction perpendicular to a surface thereof, by drawing the Si substrate in a direction perpendicular to a surface thereof or by applying a shearing force to the Si substrate.

It is preferable that the non-porous layer is made of single-crystal Si, single-crystal Si having an oxidized Si layer on a surface to be bonded or a single-crystal compound semiconductor. It is preferable that the support substrate is a Si substrate, a Si substrate having an oxidized Si layer on a surface to be bonded or a light transmittable substrate. It is preferable that the bonding step is performed by anode bonding, pressurization, heat treatment or a combination thereof. It is preferable that a porous Si removing step is provided, after the separating step, for removing the porous Si layer exposed on a surface of the support substrate and exposing the non-porous layer. It is preferable that the porous Si removing step is performed by an electroless wet etching using at least one of hydrofluoric acid, a mixed liquid obtained by adding at least one of alcohol and aqueous hydrogen peroxide to hydrofluoric acid, buffered hydrofluoric acid, and a mixed liquid obtained by adding a least one of alcohol and hydrogen peroxide water to buffered hydrofluoric acid. It is preferable that a flattening step is provided for flattening a surface of the non-porous layer after the porous Si removing step. It is preferable that the flattening step is performed by heat treatment in an atmosphere including hydrogen.

The porous-forming step may form porous Si layers on both sides of the Si substrate, and the bonding step may bond two support substrates to the porous Si layers formed on both sides of the Si substrate. A second non-porous layer forming step can be provided, after the separating step, for again forming a non-porous layer on the surface of the porous Si layer exposed on the surface of the Si substrate, and that a second ion implanting step is provided, after the porous layer forming step, for implanting ions into the porous Si layer with a given projection range and forming a porous Si layer with large porosity in the porous Si layer. It is preferable that the porous-forming step is performed by anodization. It is preferable that the anodization is performed in a HF solution.

The high-porosity layer forming step can be carried out by also altering the current density, during the porous-forming step.

After removing an remaining porous layer, the Si substrate separated by the foregoing method may be reused as a Si substrate by performing the surface flattening process if the surface flatness is insufficient. The surface flattening process may be polishing, etching or the like normally used in semiconductor processing. On the other hand, heat treatment in an atmosphere including hydrogen may also be used. By selecting the conditions, this heat treatment can achieve flatness to an extent where the atomic step is locally presented.

According to the method of producing the semiconductor substrate of the present invention, upon removal of the Si substrate, the Si substrate can be separated at one time in a large area via the porous layer. Thus, the process can be shortened. Further, since the separating position is limited to within the porous layer with large porosity due to the ion implantation, thicknesses of the porous layer remaining on the support substrate side can be uniform so that the porous layer can be removed with excellent selectivity.

According to the producing method of the semiconductor substrate of the present invention, the Si substrate can be separated in advance in one step over a large area via the porous layer. Thus, the grinding, polishing or etching process which was essential in the prior art for removing the Si substrate to expose the porous silicon layer can be omitted to shorten the process. Further, since the separating position is limited to within the porous layer with large porosity by implanting ions of at least one kind of noble gas, hydrogen and nitrogen into the porous layer so as to have the projection range, thicknesses of the porous layer remaining on the support substrate side can be uniform so that the porous layer can be removed with excellent selectivity. It is unlikely that the thickness of the remaining porous layer is thin locally, so that the non-porous layer appears on the surface earlier and is etched accordingly. In that case, the method of forming the porous layer having a high porosity is not restricted to ion implantation, but formation can also be realized by altering the electric current at anodization. Specifically, not only the grinding or etching process which was essential in the prior art for exposing porous silicon can be omitted, but also the removed Si substrate can be reused as a Si substrate by removing the remaining porous layer. If the surface flatness after removing the porous silicon is insufficient, the surface flattening process is performed. Since the position where the bonded two substrates are separated is regulated by the projection range, the dispersion of the separating positions within porous silicon does not occur as in the prior art. Thus, upon removal of porous silicon, the single-crystal silicon layer is prevented from being exposed and etched to deteriorate the uniformity of thickness. Further, the Si substrate can be reused in the desired number of times until its structural strength makes it impossible. Further, since the separating position is restricted to around the depth corresponding to the projection range of the ion implantation, the thickness of the porous layer can be set smaller as compared with the prior art. Further, it is capable of making the layer having a high porosity a layer having a specific depth constant from the surface of the porous layer to separate it, so that the crystallizability of the porous layer is not deteriorated.

Alternatively, without removing the remaining porous layer, the separated Si substrate can be reused again as a Si substrate of the present invention by forming a non-porous single-crystal Si layer. Also in this case, the Si substrate can be reused in the desired number of times until its structural strength makes it impossible.

In the conventional method of producing the bonded substrates, the Si substrate is gradually removed from one side thereof through grinding or etching. Thus, it is impossible to effectively use both sides of the Si substrate for bonding to the support substrate. On the other hand, according to the present invention, the Si substrate is held in the initial state other than its surface layers so that, by using both sides of the Si substrate as the main surfaces and bonding the support substrates to the sides of the Si substrate, respectively, two bonded substrates can be simultaneously produced from one Si substrate. Thus, the process can be shortened and the productivity can be improved. As appreciated, also in this case, the separated Si substrate can be recycled as a Si substrate after removing the remaining porous Si.

Specifically, the present invention uses a single-crystal Si substrate which is economical, flat and uniform over a large area and has excellent crystalline properties, and removes from one side thereof to a Si or compound semiconductor active layer formed on the surface which thus remains, so as to provide a single-crystal Si layer or a compound semiconductor single-crystal layer with fewer defects on an insulating material.

The present invention provides a method of producing a semiconductor substrate which is capable of achieving a Si or compound semiconductor single-crystal layer with a crystalline property as good as a single-crystal wafer on a transparent substrate (light transmittable substrate), with high productivity, high uniformity, excellent controllability and reduced cost.

Further, the present invention provides a method of producing a semiconductor substrate which is replaceable for an expensive SOS or SIMOX upon producing a large scale integrated circuit of an SOI structure.

According to the present invention, the single-crystal compound semiconductor layer with excellent crystalline property can be formed on porous Si, and further, this semiconductor layer can be transferred onto the large-area insulating substrate which is cost efficient. Thus, the foregoing problem of the difference in lattice constant and thermal expansion coefficient can be sufficiently suppressed so as to form the compound semiconductor layer with excellent crystallinity on the insulating substrate.

Further, since porous Si has a low mechanical strength and an extensive surface area, removing the porous Si layer of the present invention can also be performed by selective polishing using the single-crystal layer as a polishing stopper.

According to the method of producing the semiconductor substrate, since the porous layer of fine structure can be formed after formation of the single-crystal silicon layer on the porous layer, the epitaxial growth conditions of the single-crystal layer can be free of influence of the structural changes of the porous layer. Specifically, since the fine-structure porous layer, working as a luminescent layer, which tends to change due to thermal treatment, can be formed after completion of thermal treatment for the film formation, its characteristics can be stable.

According to the method of producing the semiconductor substrate, upon removing the Si substrate, the Si substrate can be separated in one step over a large area via the porous layer and, the process can be shortened. Further, since the separating position is limited to within the porous layer by means of the ion implantation, thicknesses of the porous layer remaining on the support substrate side can be uniform so that the porous layer can be removed with high selectivity. Thus, even when etching is unstable due to the size of apparatus or the change of the environment, the non-porous thin film, such as the single-crystal Si layer or the compound semiconductor single-crystal layer, which is economical, flat and uniform over the large area and has the extremely excellent crystalline property, can be transferred onto the support substrate with high yield. Specifically, the SOI structure with the single-crystal Si layer formed on the insulating layer can be obtained with high uniformity of film thickness and high yield. Further, since the separating position is regulated by the project range of the ion implantation so as to be within the porous layer, the thicknesses of the porous layer remaining on the support substrate side can be uniform so that the porous layer can be removed with high selectivity. Further, the removed Si substrate can be reused as an Si substrate by removing the remaining porous layer. If the surface flatness after removing porous silicon is insufficient, the surface flattening process is performed.

The present invention provides a producing method of a semiconductor substrate which is capable of achieving a Si or compound semiconductor single-crystal layer with a crystalline property as good as a single-crystal wafer on a transparent substrate (light transmittable substrate), with high productivity, high uniformity, excellent controllability and reduced cost.

According to the method of producing the semiconductor substrate of the present invention, since the selective etching with a good ratio of etching selectively can be performed, by performing the bonding with the support substrate, a SOI substrate or the compound semiconductor single crystal on the support substrate, which is flat and uniform over the large area and has an extremely excellent crystalline property, can be achieved.

Further, according to the method of producing the semiconductor substrate, the single-crystal compound semiconductor layer with high crystalline property can be formed on porous Si, and further, this semiconductor layer can be transferred onto a large-area insulating substrate which is economical. Thus, the foregoing problems of the differences in lattice constants and thermal expansion coefficients can be sufficiently suppressed to form the compound semiconductor layer with excellent crystalline properties on the insulating substrate.

Further, even if non-formation regions of the implanted layer are formed due to presence of foreign matter on the surface upon ion implantation, since the mechanical strength of the porous layer itself is smaller than bulk Si, the separation occurs in the porous layer. Thus, the two bonded substrates can be separated without causing damages such as cracks in the non-porous single-crystal silicon layer.

Further, since the gettering effect is available at the ion-implanted region, even if metal impurities exist, the two bonded substrates are separated after achieving the gettering of the impurities into the ion-implanted region, and then the ion-implanted region is removed so that it is also effective against impurity contamination.

Further, since the separating region is limited to the ion-implanted region within the porous layer, the depths of the separating region do not disperse within the porous layer. Accordingly, even if the ratio of selectively etching porous silicon is insufficient, a time for removing porous silicon can be rendered substantially constant so that the thickness uniformity of the single-crystal silicon layer transferred onto the support substrate is not spoiled.

BRIEF DESCRIPTION OF THE DRAWINGS

FIGS. 5A to 5F are schematic diagrams for explaining a semiconductor substrate producing process according to a fifth preferred embodiment of the present invention;

FIGS. 9A to 9G are schematic diagrams for explaining a semiconductor substrate producing process according to a seventh preferred embodiment of the present invention;

DETAILED DESCRIPTION OF THE PREFERRED EMBODIMENTS

Figure 1A:
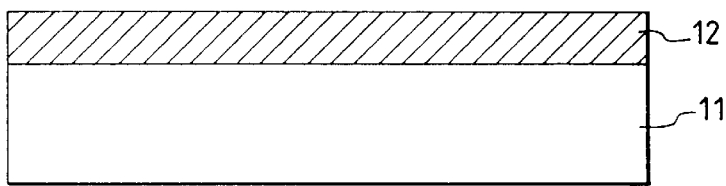
FIGS. 1A and 1B are schematic diagrams for explaining a semiconductor substrate producing process according to a first preferred embodiment of the present invention.

The present invention simultaneously solves the foregoing various problems by superposing a finer porous structure in the foregoing porous layer.

It has been reported that, by performing ion implantation of helium or hydrogen into bulk silicon and applying heat thereto, micro-cavities having diameters in the range from several nanometers to several tons of nanometers are formed at the implanted region in the density of as much as $10^{16}$ to $10^{17}/cm^3$ (for example, A. Van Veen, C. C. Griffioen, and J. H. Evans, Mat. Res. Soc. Symp. Proc. 107 (1988, Material Res. Soc. Pittsburgh, Pa.) p. 449). Recently, utilizing these micro-cavity groups as gettering sites of metal impurities has been investigated.

V. Raineri and S. U. Campisano implanted helium ions into bulk silicon and applied a heat treatment thereto to form the cavity groups, then exposed the sides of the cavity groups by forming grooves in the substrate and applied an oxidation treatment thereto. As a result, the cavity groups were selectively oxidized to form a buried silicon oxide layer. That is, they reported that the SOI structure could be formed (V. Raineri and S. U. Campisano, Appl. Phys. Lett. 66 (1995) p. 3654). However, in their method, thicknesses of the surface silicon layer and the buried silicon oxide layer were limited to achieve both formation of the cavity groups and relaxation of stresses introduced due to volume expansion upon oxidation and further the formation of the grooves were necessary for selective oxidation so that the SOI structure could not be formed all over the substrate. Such formation of the cavity groups has been reported as a phenomenon following the implantation of light elements into metal along with an expansion or separation phenomenon of the cavity groups as a part of the research about a first reactor wall of the nuclear fusion reactor.

Porous Si was found in the course of the research of electropolishing of the semiconductor in 1956 by Uhlir and collaborator (A. Uhlir, Bell Syst. Tech. J., vol. 35, 333 (1956)). Porous silicon can be formed by anodizing the Si substrate in the HF solution. Unagami and collaborator researched the dissolution reaction of Si in the anodization and reported that positive holes were necessary for the anodizing reaction of Si in the HF solution and the reaction was as follows (T. Unagami, J. Electrochem. Soc., vol. 127, 476 (1980)):

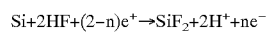

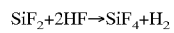

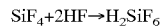

or

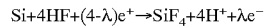

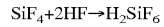

wherein $e^+$ and $e^-$ represent a hole and an electron, respectively, and n and λ represent the numbers of holes necessary for dissolution of one Si element, respectively. It was reported that porous si was formed when n>2 or λ>4 was satisfied.

As appreciated from the foregoing, p-type Si having the holes is rendered porous while n-type Si is not rendered porous. The selectivity while getting porous has been proved by Nagano and collaborators and Imai (Nagano, Nakajima, Yasuno, Oonaka, Kajiwara, Engineering Research Report of Institute of Electronics and Communication Engineers of Japan, vol. 79, SSD79-9549 (1979)), (K. Imai, Solid-State Electronics, vol. 24, 159 (1981)).

However, there have also been reports that high-concentration n-type Si can be rendered porous (R. P. Holmstrom and J. Y. Chi, Appl. Phys. Lett., vol. 42, 386 (1983)) so that it is important to choose the substrate which can be rendered porous, irrespective of p- or n-type.

Porous silicon can be formed by anodizing the Si substrate in the HF solution. The porous layer has a structure like sponge including holes of about $10^{-1}$ to 10 nm in diameter arranged at intervals of about $10^{-1}$ to 10 nm. The density thereof can be changed in the range of 1.1 to 0.6 g/cm³ by changing the HF solution concentration in the range of 50 to 20% and by changing the current density, as compared with the density 2.33 g/cm³ of the single-crystal Si. That is, the porosity can be changed. Although the density of porous Si is no more than half as compared with the single-crystal Si as described above, the monocrystalline property is maintained so that the single-crystal Si layer can be epitaxially grown at the upper part of the porous layer. However, at a temperature not less than 1,000° C., rearrangement of the internal holes occurs to spoil the accelerating etching characteristic. In view of this, it has been said that the low temperature growth, such as molecular beam epitaxial growth, plasma CVD, vacuum CVD, optical CVD, bias sputtering or liquid deposition, is suitable for the epitaxial growth of the Si layer. On the other hand, if a protective film is formed in advance on the pore walls of the porous layer by means of the method of low temperature oxidation or the like, high temperature growth is also possible.

Further, the porous layer is reduced in density to no more than half due to the formation of a lot of the internal cavities therein. As a result, since the surface area is greatly increased as compared with the volume, the chemical etching speed thereof is extremely increased as compared with the etching speed of the normal single-crystal layer.

Although the mechanical strength of porous Si differs depending on porosity, it is considered to be smaller than that of bulk Si. For example, if porosity is 50%, the mechanical strength can be considered to be half the bulk. Specifically, when a compressive, tensile or shear force is applied to the bonded wafers, the porous Si layer is ruptured first. As the porosity is increased, the porous layer can be ruptured with a weaker force.

The present invention simultaneously solves the foregoing various problems by superposing a finer porous structure in the foregoing porous layer.

It has been found that, when ion implantation of at least one kind of noble gas, hydrogen and nitrogen is performed into the porous layer with a projection range ensured, the porosity of the implanted region is increased. When observing in detail the implanted layer using an electron microscope, a lot of micro-cavities were formed in the pore walls of the porous layer formed in advance. Specifically, the fine porous structure was formed. Upon irradiation of ultraviolet light, the luminous phenomenon at the wavelength around 700 nm was confirmed.

If choosing further implantation conditions, porous silicon can be separated at a depth corresponding to the projection range of the ion implantation.

The separation can be improved in uniformity or achieved with less implantation amount by forming in advance a thin film on the pore walls of porous silicon using the method of particularly low temperature oxidation. The separation can be facilitated by applying the heat treatment after the ion implantation.

By ion-implanting at least one kind of noble gas, hydrogen and nitrogen into the porous layer with a projection range ensured after formation of at least one layer of non-porous film, such as a non-porous single-crystal silicon layer, on porous silicon or without such formation, the porosity of the implanted layer is increased. If such a Si substrate is bonded to the support substrate and then the bonded substrates are subjected to the mechanical force or the heat treatment, or even without such processes, the two bonded substrates can be separated into two at a portion of the porous silicon layer where ions are implanted.

By supporting both sides of the ion-implanted layer with a fully thick elastic or rigid body, the separation can be achieved uniformly over a large area. Further, it is possible to facilitate the separation of the substrates by applying heat treatment, force or ultrasonic waves to the substrates.

Even if non-formation regions of the implanted layer are formed due to presence of the foreign matter on the surface upon the ion implantation, since the mechanical strength of the porous layer itself is smaller than bulk Si, separation occurs in the porous layer. Thus, the two bonded substrates can be separated without causing cracks or lines in the non-porous single-crystal Si layer. In other words, the phenomenon of the separation can be selected by selecting timing for the manifestation from the time of implantation and the time of heat treatment; and a condition of implantation such as an amount of implanted beam and energy thereof. Further, the layer having a large porosity may be formed at a region of a constant depth from the surface of the porous layer by controlling the condition at anodization.

Further, by selectively removing the porous Si layer remaining on the surface of the separated substrate using the method of etching, polishing or the like, the single-crystal Si layer is exposed on the support substrate. On the other hand, after removing the remaining porous Si, the Si substrate can be again formed with porous silicon, then formed with a single-crystal Si layer and subjected to the ion implantation of at least one kind of noble gas, hydrogen and nitrogen into the porous layer with the projection range ensured, and then bonded to a support substrate. That is, the Si substrate can be recycled. Further, if the Si substrate, with the porous silicon layer remaining, is subjected to heat treatment in the reducing atmosphere including hydrogen or the like, the porous silicon surface is rendered flat and smooth so that the single-crystal silicon layer can be formed successively. By bonding the single-crystal silicon layer to the support substrate, the Si substrate can also be recycled.

According to this method, since the portion to be separated is limited to the ion-implanted region in the porous layer, the depth of the separated region is not dispersed in the porous layer. Thus, even if the ratio for selectively etching porous silicon is insufficient, porous silicon can be removed for substantially a constant time so that the uniformity of the thickness of the single-crystal silicon layer provided on the support substrate is not spoiled.

In the conventional method of producing the bonded substrates, the Si substrate is gradually removed from one side thereof through grinding or etching. Thus, it is impossible to effectively use both sides of the Si substrate for bonding to the support substrate. On the other hand, according to the present invention, the Si substrate is held in the initial state other than its surface layers so that, by using both sides of the Si substrate as the main surfaces and bonding the support substrates to the sides of the Si substrate, respectively, two bonded substrates can be simultaneously produced from one Si substrate. As appreciated, also in this case, the Si substrate can be recycled as an Si substrate after removing the remaining porous Si.

The support substrate may be, for example, a light transmittable substrate, such as a Si substrate, a Si substrate with a silicon oxide film formed thereon, a silica glass substrate or a glass substrate, or a metal substrate, but not particularly limited thereto.

The thin film formed on the porous Si layer on the Si substrate may be, for example, a non-porous single-crystal Si film, a compound semiconductor film such as GaAs or InP, a metal film or a carbon film, but not particularly limited thereto. Further, the thin film is not necessarily formed all over the porous Si layer, but may be partially etched by the patterning process.

FIRST EMBODIMENT

Figure 1B:
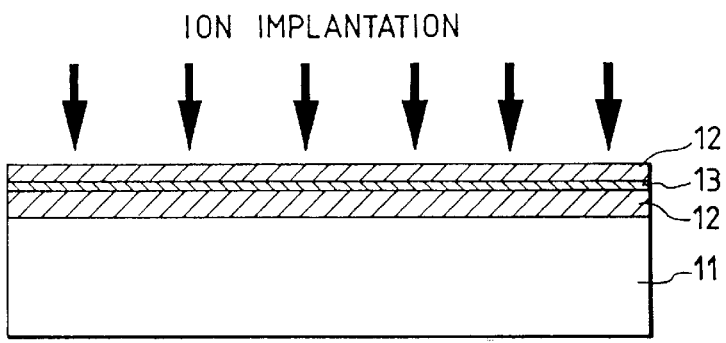

As shown in FIG. 1A, a Si single-crystal substrate 11 is first prepared and then rendered porous at its surface layer. Numeral 12 denotes the resulting porous layer. As shown in FIG. 1B, at least one kind of noble gas, hydrogen and nitrogen is ion-implanted into the porous layer 12. Then, a porous layer 13 having large porosity is formed in the porous layer 12. The charge condition of the implanted ions is not particularly limited. The acceleration energy is set such that the projection range corresponds to a depth at which the ion implantation is desired. Depending on the implantation amount, the size and the density of the micro-cavities to be formed are changed, but approximately no less than $1\times10^{13}/cm^2$ and more preferably $1\times10^{14}/cm^2$. When setting the projection range to be deeper, the channeling ion implantation may be employed. After the implantation, heat treatment is performed if necessary. In the case of the heat treatment atmosphere being an oxidizing atmosphere, the pore walls are oxidized so that attention should be given to prevent the Si region from being all changed into silicon oxide due to overoxidation.

When the light of a mercury lamp, a xenon lamp or the like is applied to the thus produced sample as the light of shorter wavelength, the sample emits the red light around 780 nm. That is, the photoluminescence is confirmed. Or an EL (Electroluminescence) element can be formed.

In FIG. 1B, the semiconductor substrate of the present invention is shown. The layer 13 is the porous Si layer with the large porosity obtained as the result of the foregoing ion implantation. The fine porous structure showing the luminous phenomenon is formed uniformly in a large area all over the wafer. Further, the metallic luster is held on the surface, that is, not showing the stained manner as in the prior art, so that metallic wiring can be easily arranged.

SECOND EMBODIMENT

Figure 2A:
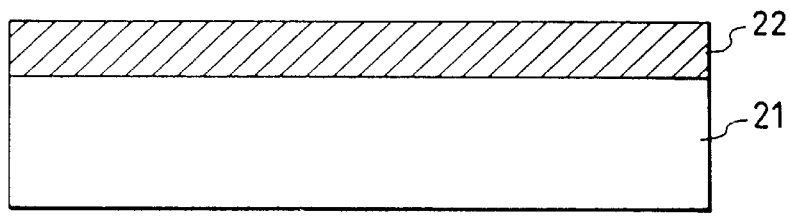
FIGS. 2A to 2C are schematic diagrams for explaining a semiconductor substrate producing process according to a second preferred embodiment of the present invention.
Figure 2B:
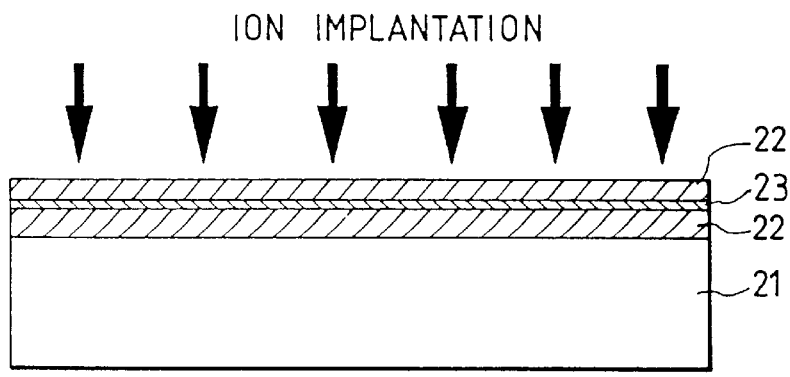

As shown in FIG. 2A, a Si single-crystal substrate 21 is first prepared and then rendered porous at its surface layer. Numeral 22 denotes the resulting porous layer. As shown in FIG. 2B, at least one kind of noble gas, hydrogen and nitrogen is ion-planted into the porous layer 22. Then, a porous layer (ion-implanted layer) 23 having large porosity is formed in the porous layer 22. The charge condition of the implanted ions is not particularly limited. The acceleration energy is set such that the projection range corresponds to a depth at which the ion implantation is desired. Depending on the implantation amount, the size and the density of the micro-cavities to be formed are changed, but approximately no less than $1\times10^{14}/cm^2$ and more preferably $1\times10^{15}/cm^2$. When setting the projection range to be deeper, the channeling ion implantation may be employed. After the implantation, the heat treatment is performed or at least one of compressive, tensile and shear stresses is applied to the wafer in a direction perpendicular to the surface as necessary, so as to divide the semiconductor substrate into two at the ion-implanted layer as a border. In the case of the heat treatment atmosphere being an oxidizing atmosphere, the pore walls are oxidized so that attention should be given to preventing the Si region from being all changed into silicon oxide due to overoxidation.

Figure 2C:
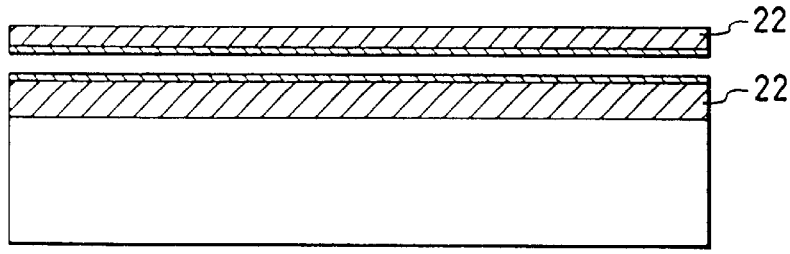

In FIG. 2C, the extremely thin porous substrate obtained by the present invention is shown. Since the division of the substrate starts spontaneously upon the heat treatment or the like as a trigger due to the internal stress introduced upon the implantation, the extremely thin porous structure can be formed uniformly all over the substrate. The pores of the porous structure are formed from one main surface of the substrate toward the other main surface. Accordingly, when the gas is implanted under pressure from the one main surface, it is ejected out from the other main surface. In this case, since the pore size of the porous structure is in the range from several nanometers to several tens of nanometers, a particle greater than this can not pass therethrough. On the other hand, although pressure loss is caused depending on the pore size, the pore density and a thickness of the extremely thin porous substrate, the strength of the substrate and the pressure loss can be both within the practical range if the thickness of the porous layer is approximately no more than 20 μm.

THIRD EMBODIMENT

Figure 3A:
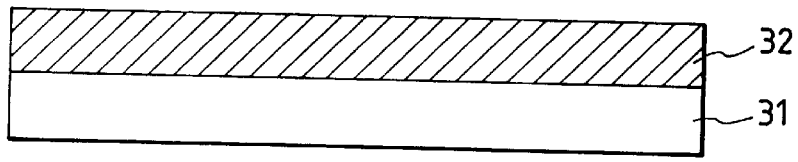
FIGS. 3A to 3C are schematic diagrams for explaining a semiconductor substrate producing process according to a third preferred embodiment of the present invention.
Figure 3B:
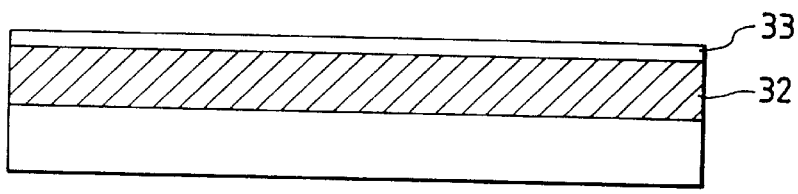

As shown in FIG. 3A, a Si single-crystal substrate 31 is first prepared and then rendered porous at its surface layer. Numeral 32 denotes the resulting porous layer. Subsequently, as shown in FIG. 3B, at least one layer 33 is formed on the porous layer. The film to be formed is arbitrarily selected from among a single-crystal Si film, a polycrystalline Si film, an amorphous Si film, a metal film, a compound semiconductor film, a superconductive film and the like.

Figure 3C:
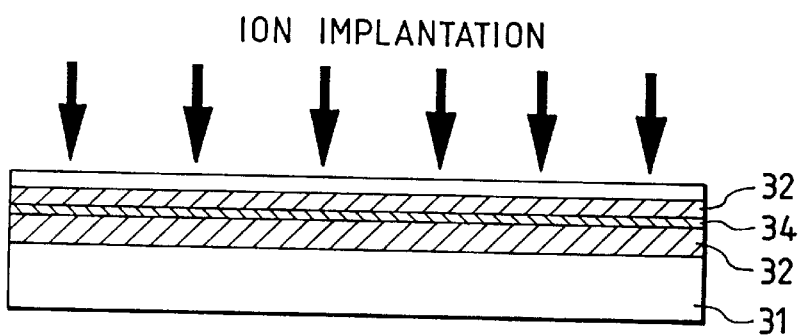

As shown in FIG. 3C, at least one kind of noble gas, hydrogen and nitrogen is ion-implanted into the porous layer 32. Then, a porous layer 34 having large porosity is formed in the porous layer 32. The charge condition of the implanted ions is not particularly limited. The acceleration energy is set such that the projection range corresponds to a depth at which the ion implantation is desired. Depending on the implantation amount, the size and the density of the micro-cavities to be formed are changed, but approximately no less than $1\times10^{14}/cm^2$ and more preferably $1\times10^{15}/cm^2$. When setting the projection range to be deeper, the channeling ion implantation may be employed. After the implantation, heat treatment is performed as necessary. In the case of the heat treatment atmosphere being the oxidizing atmosphere, the pore walls are oxidized so that attention should be given to preventing the Si region from being all changed into silicon oxide due to overoxidation.

When the light of a mercury lamp, a xenon lamp or the like is applied to the thus produced sample as the light of shorter wavelength, the sample emits the red light around 780 nm. That is, the photoluminescence is confirmed. Or an EL element can be formed.

The EL element shown in FIG. 12 is realized by forming a construction where a voltage is applied to a porous layer having a large porosity formed in the porous layer by means of ion implantation and so forth. For example, when turning $p^+$ substrate 121 porous, the EL element is realized by implanting phospho-ion and so forth in porous layer 122 including porous layer 123 having a large porosity from the surface in a manner of making the ion reach a region of a constant depth from the surface, or by diffusing the ion by means of heat diffusion etc., to form a p-n junction in porous layer 123 having a large porosity or in neighborhood thereof. A portion 127 is an n-region of the porous layer having a large porosity, which region is obtained as a result of the above-mentioned process.

Figure 12A:
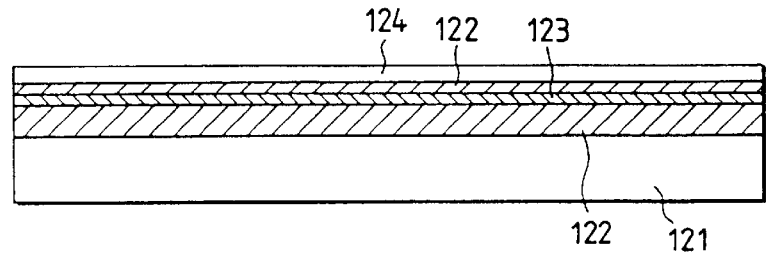
FIGS. 12A to 12D are sectional views showing a process of an EL element.
Figure 12B:
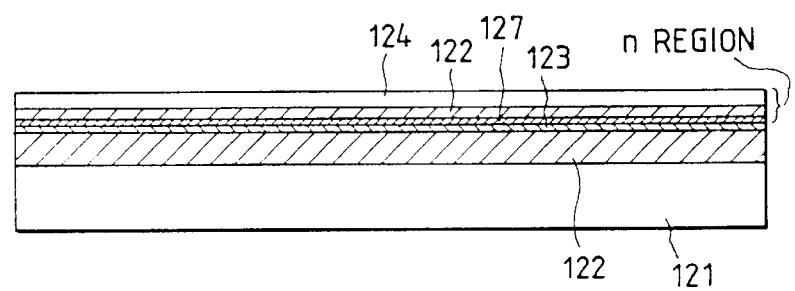
Figure 12C:
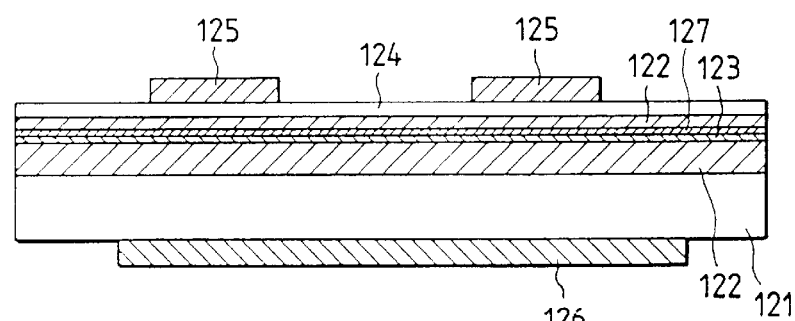
Figure 12D:
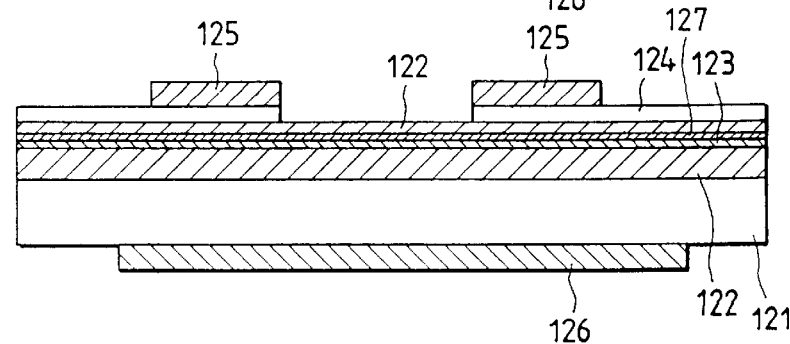

Electrodes 125 and 126 are secured with the substrate and the surface of the porous portion. The electrodes may be formed in the side of the surface of the porous portion by a process comprised of forming epitaxial Si layer 124 on the porous portion prior to the formation of the electrode and then forming the electrode thereon (see FIG. 12C). Further, as shown in FIG. 12D, the epitaxial Si layer may be removed partly as the occasion demands so as to facilitate the penetration of the light of the EL.

In FIG. 3B, the semiconductor substrate of the present invention is shown. The fine porous structure showing the luminous phenomenon is formed uniformly in a large area all over the wafer. Further, the metallic luster is held on the surface, that is, not showing the cracks or the like as in the prior art, so that metallic wiring can be easily arranged.

FOURTH EMBODIMENT

Figure 4A:
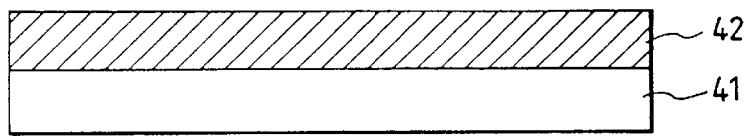
FIGS. 4A to 4F are schematic diagrams for explaining a semiconductor substrate producing process according to a fourth preferred embodiment of the present invention.

As shown in FIG. 4A, a Si single-crystal substrate 41 is first prepared and then rendered porous at its surface layer.

Figure 4B:
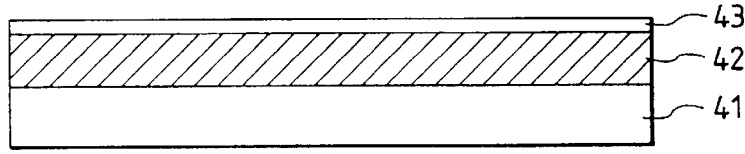

Numeral 42 denotes the resulting porous layer. Subsequently, as shown in FIG. 4B, at least one non-porous thin film 43 is formed on the porous layer. The film to be formed is arbitrarily selected from among a single-crystal Si film, a polycrystalline Si film, an amorphous Si film, a metal film, a compound semiconductor film, a superconductive film and the like. Or an element structure such as a MOSFET may be formed.

Figure 4C:
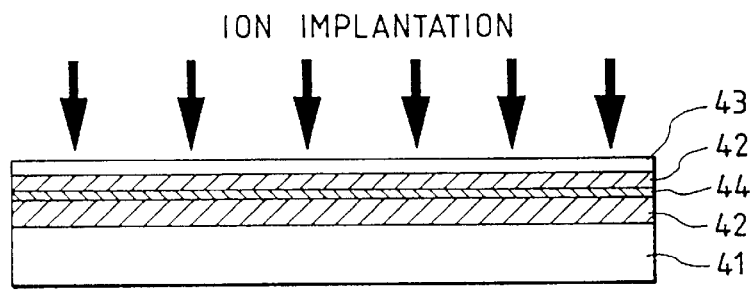

As shown in FIG. 4C, at least one kind of noble gas, hydrogen and nitrogen is ion-implanted into the porous layer 42 so as to form an implanted layer 44. When observing the implanted layer by a transmission electron microscope, formation of numberless micro-cavities can be seen. The charge condition of the implanted ions is not particularly limited. The acceleration energy is set such that the projection range corresponds to a depth at which the ion implantation is desired. Depending on the implantation amount, the size and the density of the micro-cavities to be formed are changed, but approximately no less than $1\times10^{14}/cm^2$ and more preferably $1\times10^{15}/cm^2$. When setting the projection range to be deeper, the channeling ion implantation may be employed. After the implantation, the heat treatment is performed as necessary. In case of the heat treatment atmosphere being the oxidizing atmosphere, the pore walls are oxidized so that attention should be given to preventing the Si region from being all changed into silicon oxide due to overoxidation.

Figure 4D:
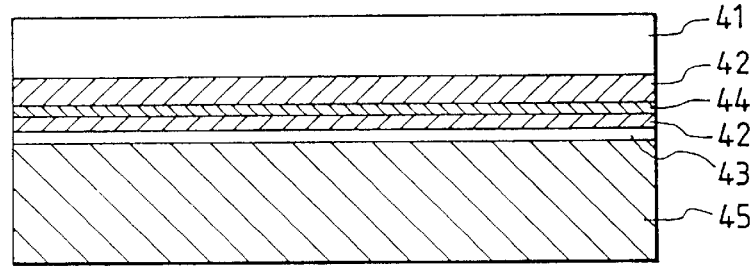

As shown in FIG. 4D, after abutting a support substrate 45 and the surface of the first substrate with each other at room temperature, they are bonded to each other through anodic bonding, pressurization, heat treatment or a combination thereof. As a result, both substrates are firmly coupled with each other.

When single-crystal Si is deposited, it is preferable to perform the bonding after oxidized Si is formed on the surface of single-crystal Si through thermal oxidation or the like. on the other hand, the support substrate can be selected from among a Si substrate, a Si substrate with a silicon oxide film formed thereon, a light transmittable substrate such as quartz, a sapphire substrate and the like, but not limited thereto as long as the surface serving for the bonding is fully flat. The bonding may be performed in three plies with an insulating thin plate interposed therebetween.

Figure 4E:
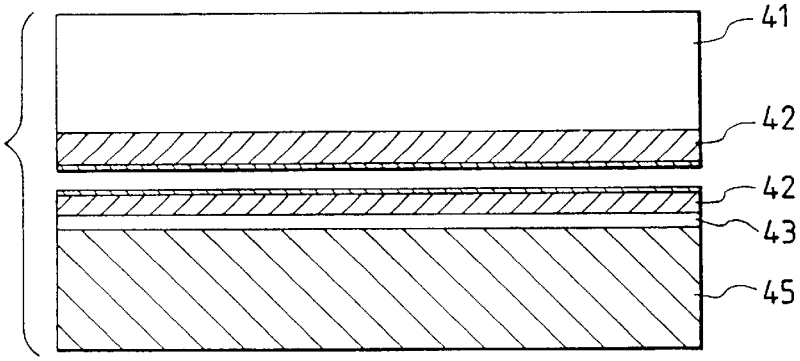

Subsequently, the substrates are divided at the ion-implanted layer 44 in the porous Si layer 42 (FIG. 4E). The structure of the second substrate side includes the porous Si layer 42, the non-porous thin film (for example, the single-crystal Si layer) 43 and the second substrate 45.

Further, the porous Si layer 42 is selectively removed. In case of the non-porous thin film being single-crystal Si, only the porous Si layer 42 is subjected to the electroless wet chemical etching using at least one of the normal Si etching liquid, hydrofluoric acid being the porous Si selective etching liquid, a mixed liquid obtained by adding at least one of alcohol and aqueous hydrogen per oxide to hydrofluoric acid, buffered hydrofluoric acid, and a mixed liquid obtained by adding at least one of alcohol and aqueous hydrogen peroxide to buffered hydrofluoric acid, so as to render the film formed in advance on the porous layer of the first substrate remaining on the second substrate. As described above in detail, only the porous Si layer can be selectively etched using the normal Si etching liquid due to the extensive surface area of porous Si. Alternatively, the porous Si layer 42 may be removed through selective polishing using the single-crystal Si layer as a polishing stopper.

In the case where the compound semiconductor layer is formed on the porous layer, only the porous Si layer 42 is subjected to chemical etching using the etching liquid which has the greater etching speed for Si relative to the compound semiconductor, so that the thickness-reduced single-crystal compound semiconductor layer 43 remains on the insulating substrate 45. Alternatively, the porous Si layer 42 is removed through selective polishing using the single-crystal compound semiconductor layer 43 as a polishing stopper.

Figure 4F:
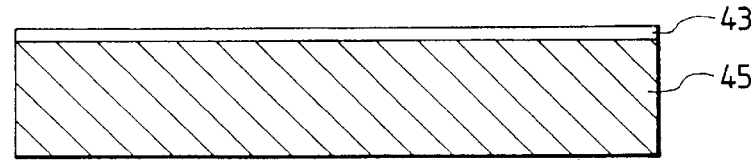
Figure 6A:
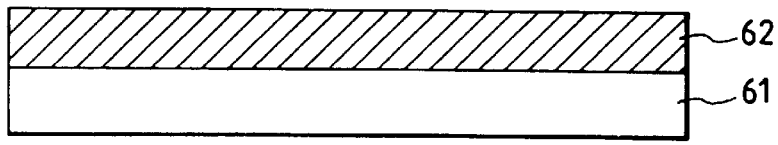
FIGS. 6A to 6E are schematic diagrams for explaining a semiconductor substrate producing process which has been proposed before.
Figure 6B:
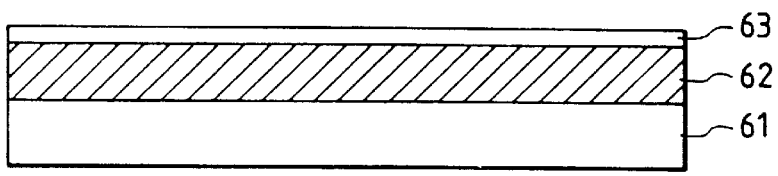
Figure 6C:
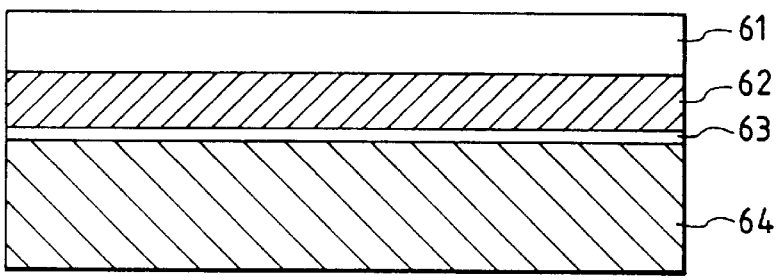
Figure 6D:
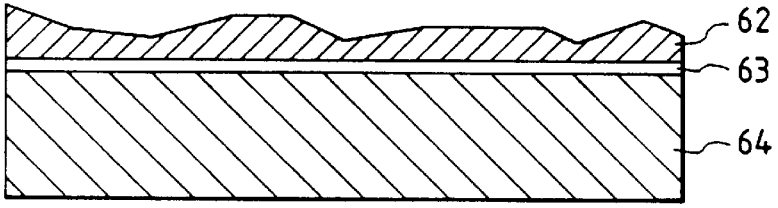
Figure 6E:
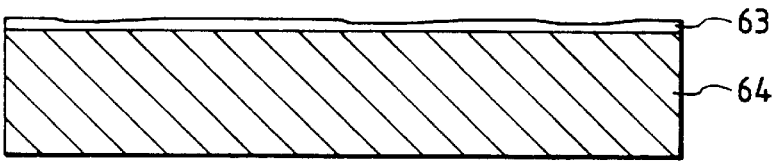
Figure 7A:
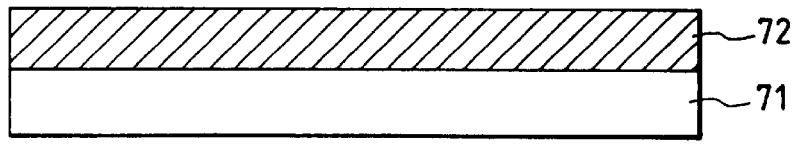
FIGS. 7A to 7E are schematic diagrams for explaining a conventional semiconductor substrate producing process.
Figure 7B:
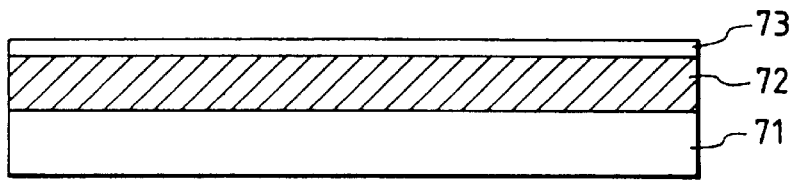
Figure 7C:
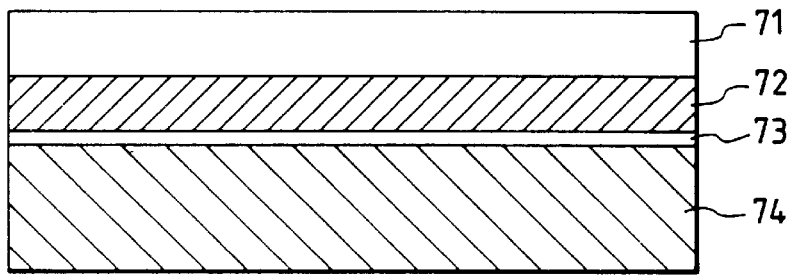
Figure 7D:
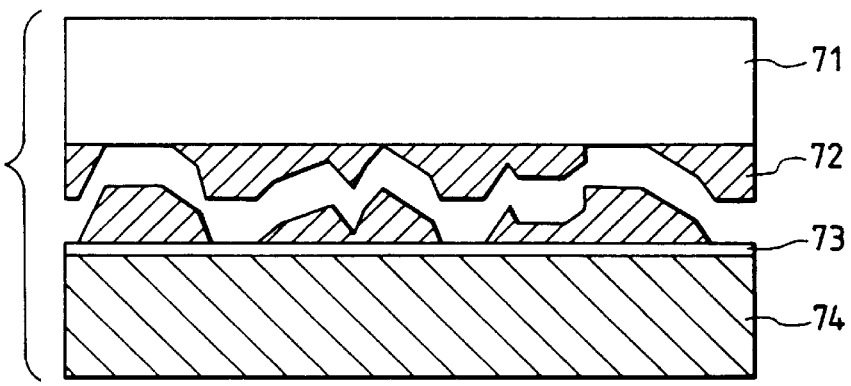
Figure 7E:
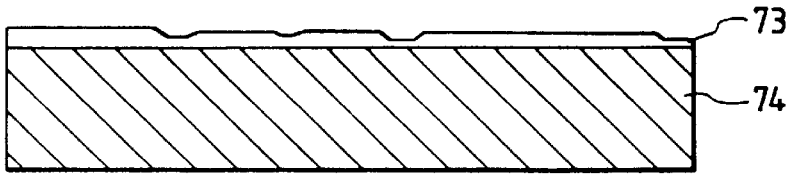

In FIG. 4F, the semiconductor substrate of the present invention is shown. On the insulating substrate 45, the non-porous thin film, such as the a single-crystal Si thin film 43, is formed in a large area all over the wafer, flatly and uniformly reduced in thickness. The semiconductor substrate thus obtained can be suitably used in production of an insulated electronic element.

The Si single-crystal substrate 41 can be reused as a Si single-crystal substrate 41 after removing any remaining porous Si and after performing surface-flattening if the surface flatness makes the substrate unusable.

Alternatively, a non-porous thin film may be again formed without removing porous Si so as to provide the substrate as shown in FIG. 4B, which is then subjected to the processes shown in FIGS. 4C to 4F.

FIFTH EMBODIMENT

As shown in FIG. 5A, a Si single-crystal substrate 51 is first prepared and then rendered porous at both surface layers thereof. Numerals 52 and 53 denote the obtained porous layers. Subsequently, as shown in FIG. 5B, at least one non-porous thin film 54, 55 is formed on each of the porous layers. The film to be formed is arbitrarily selected from among a single-crystal Si film, a polycrystalline Si film, an amorphous Si film, a metal film, a compound semiconductor film, a superconductive film and the like. Or an element structure such as a MOSFET may be formed.

As shown in FIG. 5C, at least one kind of noble gas, hydrogen and nitrogen is ion-implanted into the porous layers 52 and 53 so as to form implanted layers 56 and 57. When observing the implanted layers by a transmission electron microscope, formation of numberless micro-cavities can be seen, and accordingly the porosity enlarges. The charge condition of the implanted ions is not particularly limited. The acceleration energy is set such that the projection range corresponds to a depth at which the ion implantation is desired. Depending on the implantation amount, the size and the density of the micro-cavities to be formed are changed, but they are approximately no less than $10^{14}/cm^2$ and more preferably $1\times10^{15}/cm^2$. When setting the projection range deeper, channeling ion implantation may be employed. After the implantation, heat treatment is performed as necessary. In the case of the heat treatment atmosphere being oxidizing an atmosphere, the pore walls are oxidized so that attention should be given to preventing the Si region from being all changed into silicon oxide due over oxidation.

As shown in FIG. 5D, after abutting two support substrates 58 and 59 and the surfaces of the non-porous thin films 54 and 55 of the first substrate with each other at room temperature, they are bonded to each other through anode bonding, pressurization, heat treatment or a combination thereof. As a result, the three substrates are firmly coupled with each other.

Alternatively, the bonding may be performed in five plies with insulating thin plates interposed therebetween.

When single-crystal Si is deposited, it is preferable to perform the bonding after oxidized Si is formed on the surface of single-crystal Si through thermal oxidation or the like. On the other hand, the support substrate can be selected from among a Si substrate, a Si substrate with a silicon oxide film formed thereon, a light transmittable substrate such as quartz, a sapphire substrate and the like, but not limited thereto as long as the surface serving for the bonding is completely flat.

The bonding may be performed in three plies with an insulating thin plate interposed therebetween.

Subsequently, the substrates are divided at the ion-implanted layers 56 and 57 in the porous Si layers 52 and 53 (FIG. 5E). The structure of each of the two support substrate sides includes the porous Si layer 52, 53, the non-porous thin film (for example, the single-crystal Si layer) 54, 55 and the support substrate 58, 59.

Further, the porous Si layer 52, 53 is selectively removed. In case of the non-porous thin film being single-crystal Si, only the porous Si layer 52, 53 is subjected to the electroless wet chemical etching using at least one of the normal Si etching liquid, hydrofluoric acid being the porous Si selective etching liquid, a mixed liquid obtained by adding at least one of alcohol and aqueous hydrogen peroxide to hydrofluoric acid, buffered hydrofluoric acid, and a mixed liquid obtained by adding at least one of alcohol and aqueous hydrogen peroxide to buffered hydrofluoric acid, so that the film formed in advance on the porous layer of the first substrate remains on the support substrate. As described above in detail, only the porous Si layer can be selectively etched using the normal Si etching liquid due to the extensive surface area of porous Si.

Alternatively, the porous Si layer 52, 53 may be removed through selective polishing using the single-crystal Si layer 54, 55 as a polishing stopper.

In the case where the compound semiconductor layer is formed on the porous layer, only the porous Si layer 52, 53 is subjected to chemical etching using the etching liquid which has the greater etching speed for Si relative to the compound semiconductor, so that the thickness-reduced single-crystal compound semiconductor layer 54, 55 remains on the insulating substrate. Alternatively, the porous Si layer 52, 53 is removed through selective polishing using the single-crystal compound semiconductor layer 54, 55 as a polishing stopper.

In FIG. 5F, the semiconductor substrates of the present invention are shown. On the support substrates, the non-porous thin films, such as the single-crystal Si thin films 54 and 55, are formed in large area all over the wafer, flatly and uniformly reduced in thickness, so that the two semiconductor substrates are simultaneously formed. The semiconductor substrates thus obtained can be suitably used also in view of production of the insulated electronic elements.

The first Si single-crystal substrate 51 can be reused as a first Si single-crystal substrate 51 after removing remaining porous Si and after performing surface flattening if the surface flatness makes it unusable. Alternatively, a non-porous thin film may be again formed without removing porous Si so as to provide the substrate as shown in FIG. 5B, which is then subjected to the processes shown in FIGS. 5C to 5F. The support substrates 58 and 59 are not necessarily identical with each other.

SIXTH EMBODIMENT

The sixth preferred embodiment will be described with reference to FIGS. 8A to 8E.

Figure 8A:
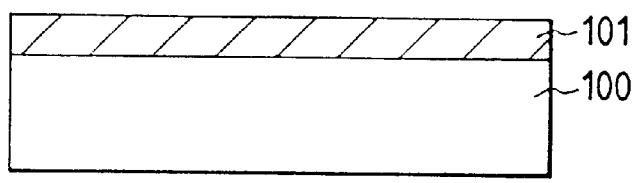
FIGS. 8A to 8E are schematic diagrams for explaining a semiconductor substrate producing process according to a sixth preferred embodiment of the present invention.

First, a single-crystal Si substrate 100 is anodized to form a porous Si layer 101 (FIG. 8A). In this case, a thickness to be rendered porous is in the range from several micrometers to several tens of micrometers on one surface layer of the substrate. It may be arranged to anodize the whole Si substrate 100.

Figure 11A:
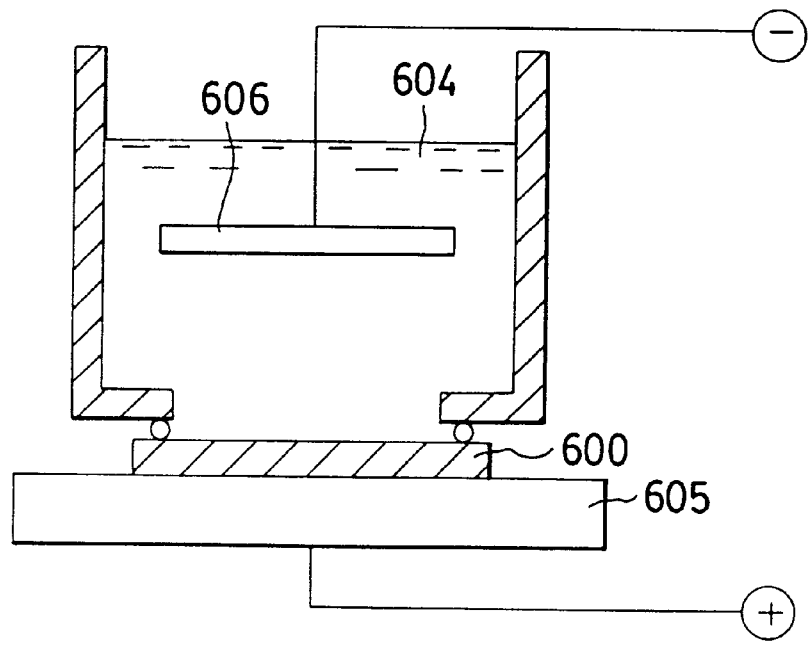
FIGS. 11A and 11B are schematic diagrams for explaining anodization.
Figure 11B:
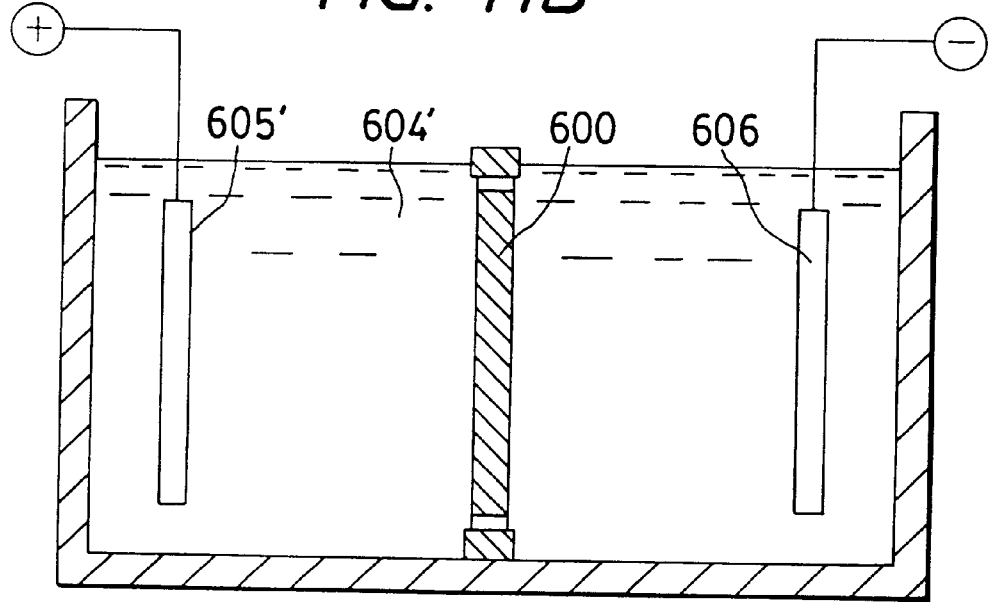

The method of forming porous silicon will be explained using FIGS. 11A and 11B. First, as the substrate, a p-type single-crystal silicon substrate 600 is prepared. An n-type may also be used. However, in this case, it is necessary that the substrate is limited to a low-resistance substrate or that the light is applied onto the surface of the substrate so as to facilitate generation of the holes. The substrate 600 is set in an apparatus as shown in FIG. 11A. Specifically, one side of the substrate is in contact with hydrofluoric acid solution 604 having therein a negative electrode 606, while the other side of the substrate is in contact with a positive metal electrode 605. On the other hand, as shown in FIG. 11B, a positive electrode 605' may also be provided in a solution 604'. In any case, the substrate is first rendered porous from the negative electrode side abutting the hydrofluoric acid solution. As the hydrofluoric acid solution 604, concentrated hydrofluoric acid (49% HF) is used in general. As diluted by pure water ($H_2O$), although depending on current values, etching occurs from a certain concentration so that it is not preferable. During anodization, bubbles are generated from the surface of the substrate 600. Alcohol may be added as a surface active agent for effective removal of the bubbles. As alcohol, methanol, ethanol, propanol, isopropanol or the like is used. Instead of the surface active agent, an agitator may be used to agitate the solution so as to achieve anodization. The negative electrode 606 is made of a material, such as gold (Au) or platinum (Pt), which does not corrode relative to the hydrofluoric acid solution. A material of the positive electrode 605 may be metal which is used in general. On the other hand, since the hydrofluoric acid solution 604 reaches the positive electrode 605 when anodization is achieved relative to the whole substrate 600, it is preferable to coat the surface of the positive electrode 605 with a metal film which is resistive to the hydrofluoric acid solution. The maximum current value for anodization is several hundreds of $mA/cm^2$, while the minimum current value therefor is arbitrary, other than zero. This current value is determined in range where the good-quality epitaxial growth is achieved on the surface of porous silicon. In general, as the current value increases, the anodization speed increases and the density of the porous Si layer decreases. That is, the volume of the pores increases. This changes the condition of the epitaxial growth.

Figure 8B:
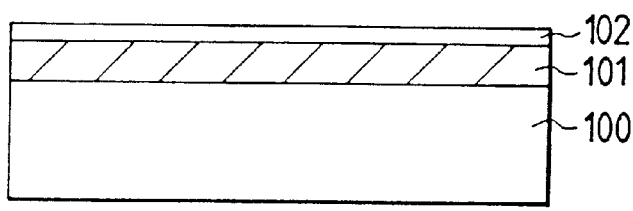

On the porous layer 101 thus formed, a non-porous single-crystal silicon layer 102 is epitaxially grown (FIG. 8B).

Figure 8C:
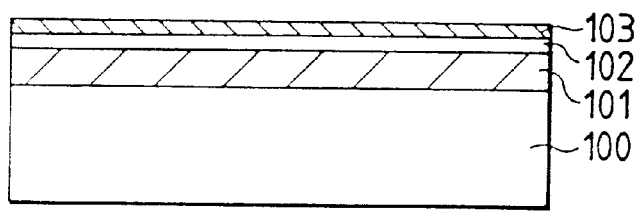

Subsequently, the surface of the epitaxial layer 102 is oxidized (including thermal oxidation) so as to form an $SiO_2$ layer 103 (FIG. 8C). This is necessary because, if the epitaxial layer is directly bonded to the support substrate in the next process, impurities tend to segregate at the bonded interface and dangling bonds of atoms at the interface increase, which will cause the thin film device to be unstable. However, this process is not essential, but may be omitted in a device structure wherein such phenomena are not serious. The $SiO_2$ layer 103 works as an insulating layer of the SOI substrate and should be formed on at least one side of the substrate to be bonded. There are various ways to form the insulating layer.

Upon oxidation, a thickness of the oxidized film is set to a value which is free of contamination taken into the bonded interface from the atmosphere.

Thereafter, the foregoing ion implantation is performed to form a layer with large porosity in the porous Si layer 101.

The substrate 100 having the foregoing epitaxial surface with the oxidized surface and a support substrate 110 having an SiO$_2$ layer 104 on the surface are prepared. The support substrate 110 may be a silicon substrate whose surface is oxidized (including thermal oxidation), quartz glass, crystallized glass, an arbitrary substrate with SiO$_2$ deposited thereon, or the like. A silicon substrate without the SiO$_2$ layer 104 may also be used as the support substrate.

Figure 8D:
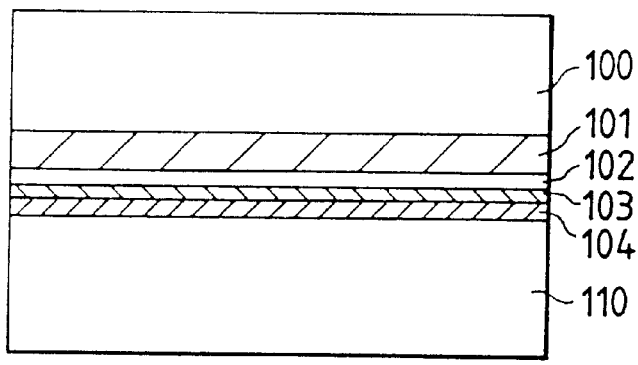

The foregoing two substrates are bonded together after cleaning them (FIG. 8D). The cleaning is performed pursuant to the process of cleaning (for example, before oxidation) the normal semiconductor substrate.

By pressurizing the whole substrate after the bonding, the bonding strength can be enhanced.

Subsequently, the bonded substrates are subjected to heat treatment. Although the higher temperature is preferable for the heat treatment, if it is too high, the porous layer 101 tends to cause structural change or the impurities contained in the substrate tend to be diffused into the epitaxial layer. Thus, it is necessary to select temperature and time which does not cause these problems. Specifically, about 600 to 1,100° C. is preferable. On the other hand, there are substrates that can not be subjected to thermal treatment at the high temperature. For example, in case of the support substrate 110 being made of quartz glass, it can be subjected to the thermal treatment only at the temperature no greater than 200° C. due to differences in the thermal expansion coefficients between silicon and quartz. If this temperature is exceeded, the bonded substrates may be separated or ruptured due to stress. The thermal treatment is sufficient as long as it can endure the stress upon grinding or etching of the bulk silicon 100 performed in the next process. Accordingly, even at the temperature no greater than 200° C., the process can be performed by optimizing the surface processing condition for activation.

Then, by the foregoing method, the substrates are separated into two at the porous Si layer having the large porosity. The layer having the large porosity can be formed by altering current in the anodization, besides the ion implantation.

Figure 8E:
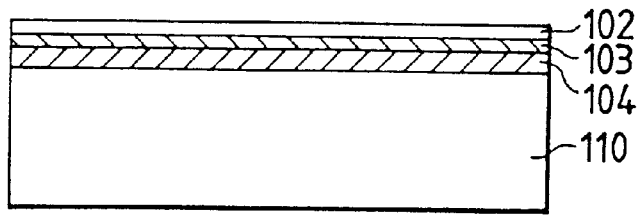
Figure 10A:
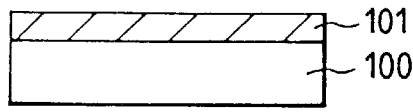
FIGS. 10A to 10G are schematic diagrams for explaining a semiconductor substrate producing process according to an eighth preferred embodiment of the present invention.
Figure 10B:
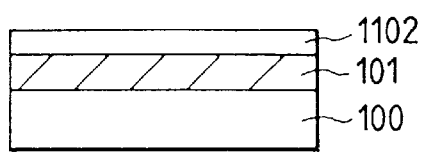
Figure 10E:
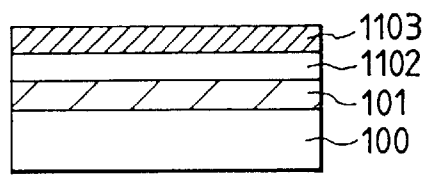
Figure 10C:
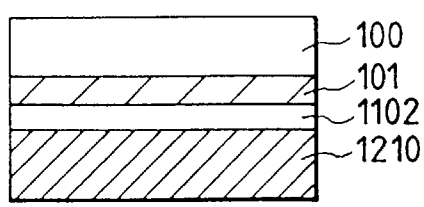
Figure 10F:
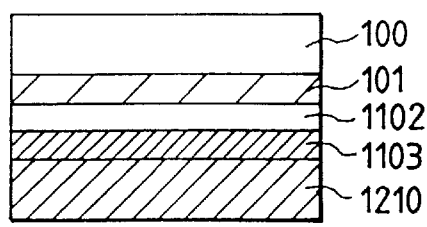
Figure 10D:
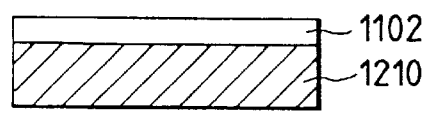
Figure 10G:
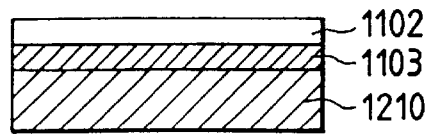

Subsequently, the silicon substrate portion 100 and the porous portion 101 are selectively removed with the epitaxial layer 102 remaining (FIG. 8E). In this fashion, the SOI substrate is obtained.

The following processes may be added to the foregoing processes:

(1) The thickness of the wall between the adjacent holes in the oxidized (preoxidation) porous silicon layer, of i.e. the pore internal walls of the porous layer is very small, that is, several nanometers to several tens of nanometers. Thus, if the high-temperature process is applied to the porous layer upon formation of the epitaxial silicon layer or upon heat treatment after bonding, the pore wall may agglomerate and enlarge so that the pore wall may clog the pore and lower the etching speed. In view of this, after formation of the porous layer, a thin oxidized film is formed on the pore wall so as to suppress the enlargement of the pore wall. On the other hand, since it is necessary to epitaxially grow the non-porous single-crystal silicon layer on the porous layer, it is necessary to oxidize only the surface of the pore inner wall such that the monocrystalline property remains inside the pore wall of the porous layer. It is preferable that the oxidized film is in the range of several angstroms to several tens of angstroms. The oxidized film of such a thickness is formed through heat treatment in an oxygen atmosphere at the temperature of 200° C. to 700° C., and more preferably 250° C. to 500° C.

(2) Hydrogen Baking Process

The present inventors have shown in the Publication No. EP553852A2 that, through heat treatment in a hydrogen atmosphere, small roughness on the silicon surface can be removed to obtain very smooth silicon surface. Also in the present invention, baking in the hydrogen atmosphere can be applied. The hydrogen baking can be performed, for example, after formation of the porous silicon layer and before formation of the epitaxial silicon layer. Apart from this, the hydrogen baking can be performed to the SOT substrate obtained after etching removal of the porous silicon layer. Through the hydrogen baking process performed before formation of the epitaxial silicon layer, a phenomenon that the pore surface is closed due to migration of silicon atoms forming the porous silicon surface. When the epitaxial silicon layer is formed in the state where the pore surface is closed, the epitaxial silicon layer with fewer crystal defects can be achieved. On the other hand, through the hydrogen baking process performed after etching of the porous silicon layer, the epitaxial silicon surface which was more or less roughened by etching can be smoothed out, and boron from the clean room inevitably taken into the bonded interface upon bonding and boron the thermally diffused in the epitaxial Si layer from the porous Si layer can be removed.

SEVENTH EMBODIMENT

The seventh preferred embodiment will be described with reference to FIGS. 9A to 9G. Numerals in FIGS. 9A to 9G which are the same as those in FIGS. 8A to 8E represent the same portions in FIGS. 8A to 8E. In the embodiment shown in FIGS. 8A to 8E, the surfaces of the two substrates to be bonded are the SiO$_2$ layer 103 and the SiO$_2$ layer 104. However, both of these surfaces are not necessarily the SiO$_2$ layers, but at least one of them may be made of SiO$_2$. In this preferred embodiment, the surface of an epitaxial silicon layer 1102 formed on a porous silicon layer is bonded to the surface of an oxidized film 1104 formed on a silicon substrate 1110, and the surface of an oxidized film 1103 formed by thermal oxidation of the surface of the epitaxial silicon layer 1102 is bonded to the surface of the silicon substrate 1110 which is not oxidized. In this preferred embodiment, the other processes can be performed as in the embodiment shown in FIGS. 8A to 8E.

EIGHTH EMBODIMENT

The eighth preferred embodiment will be described with reference to FIGS. 10A to 10G. Numerals in FIGS. 10A to 10G which are the same as those in FIGS. 8A to 8E represent the same portions in FIGS. 8A to 8E. In this preferred embodiment, a substrate bonded to a substrate formed with an epitaxial silicon film is made of a glass material 1210, such as quartz glass or blue glass. In this preferred embodiment, an epitaxial silicon layer 1102 is bonded to the glass substrate 1210, and an oxidized film 1103 formed by thermal oxidation of the surface of the epitaxial silicon layer 1102 is bonded to the glass substrate 1210. In this preferred embodiment, the other processes can be performed as in the embodiment shown in FIGS. 8A to 8E.

Hereinbelow, the present invention will be described in detail using concrete examples. However, the present invention is not limited thereto.

EXAMPLE 1

A first p- or e-type (100) single-crystal Si substrate having 625 μm in thickness, 0.01 Ω·cm in resistivity and 6 inches in diameter was anodized in an HF solution.

The anodization condition was as follows:

Current Density: 5 (mA·cm$^{-2}$)

Anodization Solution: HF:H$_2$O:C$_2$H$_5$OH=1:1:1

Time: 12 (minutes)

Thickness of Porous Si: 10 ($\mu$m)

Porosity: 15 (%)

Subsequently, He$^+$ ions of 5×10$^{16}$/cm$^2$ were implanted into the porous side of the substrate at an acceleration voltage of 30 keV. Then, the substrate was subjected to heat treatment at 850° C. in the vacuum for 8 hours.

When the light of a mercury lamp was applied to the substrate, luminescence of the red light with a wavelength around 750 nm was confirmed.

EXAMPLE 2

Two first p-type (100) single-crystal Si substrates each being 625 $\mu$m thick, 0.01 Ω·cm in resistivity and 6 inches in diameter were prepared, and one of them was anodized in an HF solution.

The anodization condition was as follows:

Current Density: 5 (mA·cm$^{-2}$)

Anodization Solution: HF:H$_2$O:C$_2$H$_5$OH=1:1:1

Time: 12 (minutes)

Thickness of Porous Si: 10 ($\mu$m)

Porosity: 15 (%)

He$^+$ ions of 5×10$^{16}$/cm$^2$ were implanted into the porous side of the anodized substrate and the surface side of the other substrate at acceleration voltage of 30 keV. Subsequently, phosphorus ions of 5×10$^{14}$/cm$^2$ were implanted into the porous side of the anodized substrate and the surface side of the other substrate at an acceleration voltage of 100 keV. Then, these substrates were subjected to the heat treatment at 850° C. in the vacuum for 8 hours. Further, ITO electrodes were deposited on the surfaces.

When the voltage was applied between the Si substrates and the ITO electrodes, luminescence of a wavelength around 750 nm was confirmed at the porous substrate, while luminescence was not confirmed at the other substrate.

EXAMPLE 3

Two first p- or e-type (100) single-crystal Si substrates each being 625 $\mu$m thick, 0.01 Ω·cm in resistivity and 6 inches in diameter were prepared and one of them was anodized in an HF solution.

The anodization condition was as follows:

Current Density: 5 (mA·cm$^{-2}$)

Anodization Solution: HF:H$_2$O:C$_2$H$_5$OH=1:1:1

Time: 12 (minutes)

Thickness of Porous Si: 20 ($\mu$m)

Porosity: 15 (%)

The anodized substrate was oxidized at 400° C. in the oxygen atmosphere for 1 hour. Through the oxidation, the pore inner walls of porous Si were coated with a thermal-oxidized film. Subsequently, hydrogen ions of 5×10$^{17}$/cm$^2$ were implanted all over the porous side of the porous substrate and all over the other substrate at an acceleration voltage of 0.76 MeV.

When these substrates were subjected to the heat treatment at 1,000° C. in the vacuum for 1 hour, the porous layer was separated uniformly all over the substrate with a thickness of about 1 $\mu$m corresponding to the ion-implanted region, while a lot of swells like blisters were only formed at the non-porous substrate.

EXAMPLE 4

The first p-type (100) single-crystal Si substrate having 625 $\mu$m in thickness, 0.01 Ω·cm in resistivity and 6 inches in diameter was anodized in an HF solution.

The anodization condition was as follows:

Current Density: 5 (mA·cm$^{-2}$)

Anodization Solution: HF:H$_2$O:C$_2$H$_5$OH=1:1:1

Time: 12 (minutes)

Thickness of Porous Si: 10 ($\mu$m)

Porosity: 15 (%)

The substrate was oxidized at 400° C. in the oxygen atmosphere for 1 hour. Through the oxidation the pore inner walls of porous Si were coated with a thermally oxidized film. Using the CVD (chemical vapor deposition) method, single-crystal Si was epitaxially grown by 0.1 mm on porous Si. The growing conditions were as follows:

Source Gas: SiH$_2$Cl$_2$/H$_2$

Gas Flow Rate: 0.5/180 l/min

Gas Pressure: 80 Torr

Temperature: 900° C.

Growing Speed: 0.3 $\mu$m/min

He$^+$ ions of 5×10$^{16}$/cm$^2$ were implanted into the porous side of the anodized substrate and the surface side of the other substrate at acceleration voltage of 30 keV. Subsequently, phosphorus ions of 5×10$^{14}$/cm$^2$ were implanted into the porous side of the anodized substrate and the surface side of the other substrate at acceleration voltage of 100 keV. Then, these substrates were subjected to heat treatment at 850° C. in the argon atmosphere for 8 hours. Further, ITO electrodes were deposited on the surfaces.

When the voltage was applied between the Si substrate and the ITO electrode, luminescence of wavelength around 750 nm was confirmed at the porous substrate.

EXAMPLE 5

Two first p- or e-type (100) single-crystal Si substrates each being 625 $\mu$m thick, 0.01 Ω·cm in resistivity and 6 inches in diameter were prepared and anodized in an HF solution.

The anodization conditions were as follows:

Current Density: 5 (mA·cm$^{-2}$)

Anodization Solution: HF:H$_2$O:C$_2$H$_5$OH=1:1:1

Time: 12 (minutes)

Thickness of Porous Si: 3 ($\mu$m)

Porosity: 15 (%)

The substrates were oxidized at 400° C. in the oxygen atmosphere for 1 hour. Through the oxidation, the pore inner walls of porous Si were coated with thermally oxidized films. Using the CVD (chemical vapor deposition) method, single-crystal Si was epitaxially grown by 0.15 $\mu$m on porous Si. The growing conditions were as follows:

Source Gas: SiH$_2$Cl$_2$/H$_2$

Gas Flow Rate: 0.5/180 l/min

Gas Pressure: 80 Torr

Temperature: 950° C.

Growing Speed: 0.3 $\mu$m/min

Further, an SiO$_2$ layer of 100 nm was formed on the surface of each epitaxial Si layer through thermal oxidation.

Subsequently, He$^+$ ions of 5×10$^{17}$/cm$^2$ were implanted into the porous side of only one of the substrates at an acceleration voltage of 50 keV.

The surface of the SiO$_2$ layer and the surface of a separately prepared support Si substrate formed with an SiO$_2$ layer of 500 nm were overlapped and abutted with each other, and subjected to heat treatment at 1,000° C. for 2 hours to increase the bonding strength. Then, the two substrates were completely separated at a position corresponding to the projection range of the ion implantation. The separated surfaces were observed in detail using an optical microscope, but exposed portions of the initial bonded interface were not found. on the other hand, no change on the outward appearance was caused on the substrate which was not subjected to the helium ion implantation, and the substrates remained bonded to each other. Thus, the porous Si substrate side of the bonded substrates (not subjected to the helium ion implantation) was ground using a grinder for the normal semiconductor to expose the porous Si layer. However, due to insufficient grinding accuracy, the whole porous layer could not be exposed.

Thereafter, the porous Si layer remaining on the support substrate side was agitated in a mixed solution (1:5) of 49% hydrofluoric acid and 30% aqueous hydrogen peroxide for selective etching. Single-crystal Si remained without being etched so that porous Si was selectively etched using single-crystal Si as an etching stopper and fully removed.

The etching speed of non-porous single-crystal Si relative to the etching liquid is extremely low so that the ratio of selective etching relative to the etching speed of the porous layer reaches no less than $10^5$ and the etching amount (about several tens of angstroms) at the non-porous layer can be ignored from a practical point of view.

Specifically, the single-crystal Si layer having 0.1 $\mu$m in thickness was formed on the Si oxidized film. No change was caused on the single-crystal Si layer even by the selective etching of porous Si.

As a result of section observation by a transmission electron microscope, it was confirmed that no new crystal defects were introduced into the Si layer and the excellent crystallinity was maintained.

Similar results were obtained even without forming the oxidized film on the surface of the epitaxial Si layer.

EXAMPLE 6

Two first p- or n-type (100) single-crystal Si substrates each being 625 $\mu$m thick, 0.01 Ω·cm in resistivity and 6 inches in diameter were prepared and anodized in a HF solution.

The anodization conditions were as follows:
Current Density: 5 (mA·cm$^{-2}$)
Anodization Solution: HF:H$_2$O:C$_2$H$_5$OH=1:1:1
Time: 12 (minutes)
Thickness of Porous Si: 10 ($\mu$m)
Porosity: 15 (%)

The substrates were oxidized at 400° C. in an oxygen atmosphere for 1 hour. Through the oxidation, the pore inner walls of porous Si were coated with thermally oxidized films. Using the CVD (chemical vapor deposition) method, single-crystal Si was epitaxially grown by 0.15 $\mu$m on porous Si. The growing conditions were as follows: The accuracy of the film thickness was ±2%.
Source Gas: SiH$_2$Cl$_2$/H$_2$
Gas Flow Rate: 0.5/180 1/min
Gas Pressure: 80 Torr
Temperature: 950° C.
Growing Speed: 0.3 $\mu$m/min Further, an SiO$_2$ layer of 100 nm was formed on the surface of each epitaxial Si layer through thermal oxidation.

Subsequently, hydrogen ions of $5 \times 10^{16}$/cm$^2$ were implanted into the porous side of only one of the substrates at an acceleration voltage of 50 keV.

The surface of the SiO$_2$ layer and the surface of a separately prepared support Si substrate formed with an SiO$_2$ layer of 500 nm were overlapped and abutted with each other, and subjected to heat treatment at 1,000° C. for 2 hours to increase the bonding strength. Then, the two substrates were completely separated at a position corresponding to the projection range of the ion implantation. The separated surfaces were observed in detail using an optical microscope, but exposed portions of the initial bonded interface were not found. On the other hand, no change in the outward appearance was caused on the substrate which was not subjected to the hydrogen ion implantation, and the substrates remained bonded to each other. The porous substrate side of the bonded substrates (not subjected to the hydrogen ion implantation) was ground using a grinder for the normal semiconductor to expose the porous layer. However, due to insufficient grinding accuracy, the thickness of the remaining porous layer was 1 to 9 $\mu$m.

Thereafter, the porous Si layer remaining on the support substrate side was agitated in a mixed solution (1:2) of 49% hydrofluoric acid and 30% aqueous hydrogen peroxide for selective etching. Single-crystal Si regained without being etched so that porous Si was selectively etched using single-crystal Si as an etching stopper and fully removed.

The etching speed of non-porous single-crystal Si relative to the etching liquid is extremely low so that the ratio of selective etching relative to the etching speed of the porous layer reaches as much as no less than $10^5$ and the etching amount (about several tens of angstroms) at the non-porous layer can be ignored from a practical point of view.

Specifically, the single-crystal Si layer having 0.1 $\mu$m in thickness was formed on the Si oxidized film. Thicknesses of the formed single-crystal Si layer were measured at 100 points thereover. Uniformity of the thicknesses was 101 nm±3 nm with the hydrogen ion implantation, while it was 101 nm±7 nm without the hydrogen ion implantation so that it was confirmed that the thickness distribution was deteriorated due to influence of dispersion of thicknesses of porous silicon.

Thereafter, the heat treatment was performed at 1,100° C. in the hydrogen atmosphere for 1 hour.

When evaluating the surface roughness using an interatomic force microscope, the mean square roughness at a 50 $\mu$m square region was about 0.2 nm which was equal to the silicon wafer on the market.

As a result of section observation by a transmission electron microscope, it was confirmed that no new crystal defects were introduced into the Si layer and excellent crystallinity was maintained.

Similar results were obtained even without forming the oxidized film on the surface of the epitaxial Si layer.

At the same time, the porous Si layer remaining on the Si substrate side was also agitated in a mixed solution (1:2) of 49% hydrofluoric acid and aqueous 30% hydrogen peroxide for selective etching. Single-crystal Si remained without being etched so that porous Si was selective-etched using single-crystal Si as an etching stopper and fully removed, and the Si substrate could be again put into the porous-forming process.

EXAMPLE 7

Two first p- or n-type (10) single-crystal Si substrates each being 625 $\mu$m thick, 0.01 Ω·cm in resistivity and 5 inches in diameter were prepared and anodized in an HF solution.

The anodization conditions were as follows:
Current Density: 5 (mA·cm$^{-2}$)
Anodization Solution: HF:H$_2$O:C$_2$H$_5$OH=1:1:1

Time: 12 (minutes)

Thickness of Porous Si: 10 ($\mu$m)

Porosity: 15 (%)

The substrates were oxidized at 400° C. in the oxygen atmosphere for 1 hour. Through the oxidation, the pore inner walls of porous Si were coated with thermally oxidized films. Using the CVD (chemical vapor deposition) method, single-crystal Si was grown by 0.55 $\mu$m on porous Si. The growing conditions were as follows. The accuracy of the film thickness was ±2%.

Source Gas: $SiH_2Cl_2/H_2$

Gas Flow Rate: 0.5/180 l/min

Gas Pressure: 80 Torr

Temperature: 900° C.

Growing Speed: 0.3 $\mu$m/min

Further, an $SiO_2$ layer of 100 nm was formed on the surface of each epitaxial Si layer through thermal oxidation.

Subsequently, hydrogen ions of $5\times10^{17}/cm^2$ were implanted into the porous side of only one of the substrates at an acceleration voltage of 100 keV.

The surface of the $SiO_2$ layer and the surface of a separately prepared support quartz substrate were exposed to oxygen plasma, respectively, then overlapped and abutted with each other, and subjected to the heat treatment at 200° C. for 2 hours to increase the bonding strength. The sufficient pressure is applied to the bonded wafers perpendicularly relative to the in-plane and uniformly over the in-plane. Then, the porous Si layer was divided into two at the ion-implanted region.

On the other hand, when the pressure was further applied to the substrate (not subjected to the hydrogen ion implantation), the porous layer was ruptured into two. However, when observing the divided porous layers, cracks were introduced into portions of the single-crystal Si layer so that the substrate could not be put into the subsequent process.

Thereafter, the porous Si layer remaining on the second substrate side was agitated in a mixed solution (1:2) of 49% hydrofluoric acid and 30% aqueous hydrogen peroxide for selective etching. Single-crystal Si remained without being etched so that porous Si was selective-etched using single-crystal Si as an etching stopper and fully removed.

The etching speed of non-porous single-crystal Si relative to the etching liquid is extremely low so that the selection ratio relative to the etching speed of the porous layer reaches no less than $10^5$ and the etching amount (about several tens of angstroms) at the non-porous layer can be ignored from a practical point of view.

Specifically, the single-crystal Si layer having 0.5 $\mu$m in thickness was formed on the Si oxidized film.

Thicknesses of the formed single-crystal Si layer were measured at 100 points thereover. Uniformity of the thicknesses was 501 nm±11 nm with the hydrogen ion implantation.

Thereafter, the heat treatment was performed at 1,100° C. in the hydrogen atmosphere for 1 hour.

When evaluating the surface roughness using an interatomic force microscope, the mean square roughness at a 50 $\mu$m square region was about 0.2 nm which was equal to the silicon wafer on the market.

As the result of section observation by a transmission electron microscope, it was confirmed that no new crystal defects were introduced into the Si layer and the excellent crystallinity property was maintained.

Similar results were obtained even without forming the oxidized film on the surface of the epitaxial Si layer.

Using the CVD (chemical vapor deposition) method, single-crystal Si was again epitaxially grown by 0.55 $\mu$m on porous Si remaining at the first substrate side. The growing conditions were as follows. The accuracy of the film thickness was ±2%.

Source Gas: $SiH_2Cl_2/H_2$

Gas Flow Rate: 0.5/180 l/min

Gas Pressure: 80 Torr

Temperature: 900° C.

Growing Speed: 0.3 $\mu$m/min

When evaluating the crystal defect density of this single-crystal Si layer through the defect revealing etching, the defect density was about $1\times10^3/cm^2$ and this substrate could be again put into the processes of ion implantation and bonding.

Similar results were obtained even without forming the oxidized film on the surface of the epitaxial Si layer.

EXAMPLE 8

Two first p- or n-type (100) single-crystal Si substrates each being 625 $\mu$m thick, 0.01 Ω·cm in resistivity and 6 inches in diameter were prepared and anodized in an HF solution.

The anodization conditions were as follows:

Current Density: 5 (mA·cm$^{-2}$)

Anodization Solution: $HF:H_2O:C_2H_5OH=1:1:1$

Time: 12 (minutes)

Thickness of Porous Si: 10 ($\mu$m)

Porosity: 15 (%)

The substrates were oxidized at 400° C. in the oxygen atmosphere for 1 hour. Through the oxidation, the pore inner walls of porous Si were coated with thermal-oxidized films. Using the CVD (chemical vapor deposition) method, single-crystal Si was epitaxial-grown grown by 0.15 $\mu$m on porous Si. The growing conditions were as follows. The accuracy of the film thickness was ±2%.

Source Gas: $SiH_2Cl_2/H_2$

Gas Flow Rate: 0.5/180 l/min

Gas Pressure: 80 Torr

Temperature: 950° C.

Growing Speed: 0.3 $\mu$m/min

Further, an $SiO_2$ layer of 100 nm was formed on the surface of each epitaxial Si layer through thermal oxidation.

Subsequently, helium ions of $5\times10^{17}/cm^2$ were implanted into the porous side of only one of the substrates at acceleration voltage of 100 keV.

The surface of the $SiO_2$ layer and the surface of a separately prepared support Si substrate formed with an $SiO_2$ layer of 500 nm were overlapped and abutted with each other, and subjected to the heat treatment at 400° C. for 2 hours. The sufficient tensile force is applied to the bonded wafers perpendicularly relative to the in-plane and uniformly over the in-plane. Then, the two substrates were completely separated at a position corresponding to the projection range of the helium ion implantation. The separated surfaces were observed in detail using an optical microscope, but exposed portions of the initial bonded interface were not found.

On the other hand, when the pressure was further applied to the substrate (not subjected to the helium ion implantation), the porous layer was ruptured into two. However, when observing the divided porous layers, cracks were introduced into portions of the single-crystal Si layer so that the substrate could not be put into the subsequent process.

Thereafter, the porous Si layer remaining on the support substrate side was agitated in a mixed solution (1:2) of 49% hydrofluoric acid and 30% aqueous hydrogen peroxide for selective etching. Single-crystal Si remained without being etched so that porous Si was selectively etched using single-crystal Si as etching stopper and fully removed.

The etching speed of non-porous single-crystal Si relative to the etching liquid is extremely low so that the selection ratio relative to the etching speed of the porous layer reaches less than $10^5$ and the etching amount (about several tens of angstroms) at the non-porous layer can be ignored from a practical point of view.

Specifically, the single-crystal Si layer having 0.1 μm in thickness was formed on the Si oxidized film. Thicknesses of the formed single-crystal Si layer were measured at 100 points thereover. Uniformity of the thicknesses was 101 nm±3 nm with the hydrogen ion implantation, while it was 101 nm±7 nm without the hydrogen ion implantation so that it was confirmed that the thickness distribution deteriorated due to influence of dispersion of thicknesses of porous silicon.

Thereafter, the heat treatment was performed at 1,100° C. in a hydrogen atmosphere for 1 hour.

When evaluating the surface roughness using an interatomic force microscope, the mean square roughness at a 50 μm square region was about 0.2 nm which was equal to the silicon wafer on the market.

As a result of section observation by a transmission electron microscope, it was confirmed that no new crystal defects were introduced into the Si layer and excellent crystallinity was maintained.

Similar results were obtained even without forming the oxidized film on the surface of the epitaxial Si layer.

At the same time, the porous Si layer remaining on the Si substrate side was also agitated in a mixed solution (1:2) of 49% hydrofluoric acid and aqueous 30% hydrogen peroxide for selective etching. Single-crystal Si remained without being etched so that porous Si was selectively etched using single-crystal Si as an etching stopper and fully removed, and the Si substrate could be again put into the porous-forming process.

EXAMPLE 9

Two first p- or n-type (100) single-crystal Si substrates each having 625 μm in thickness, 0.01 Ω·cm in resistivity and 6 inches in diameter were prepared and anodized in an HF solution.

The anodization conditions were as follows:

Current Density: 5 (mA·cm$^{-2}$)
Anodization Solution: $HF:H_2O:C_2H_5OH=1:1:1$
Time: 12 (minutes)
Thickness of Porous Si: 10 (μm)
Porosity: 15 (%)

The substrates were oxidized at 400° C. in the oxygen atmosphere for 1 hour. Through the oxidation, the pore inner walls of porous Si were coated with thermal-oxidized films. Using the MBE (molecular beam epitaxy) method, single-crystal Si was epitaxial-grown by 0.5 μm on porous Si. The growing conditions were as follows. The accuracy of the film thickness was ±2%.

Temperature: 700° C.
Pressure: $1 \times 10^{-9}$ Torr
Growing Speed: 0.1 nm/sec
Temperature: 950° C.
Growing Speed: 0.3 μm/min Further, an $SiO_2$ layer of 100 nm was formed on the surface of each epitaxial Si layer through thermal oxidation.

Subsequently, helium ions of $1 \times 10^{17}/cm^2$ were implanted into the porous side of only one of the substrates at an acceleration voltage of 100 keV.

The surface of the $SiO_2$ layer and the surface of a separately prepared support Si substrate formed with an $SiO_2$ layer of 500 nm were overlapped and abutted with each other, and subjected to heat treatment at 300° C. for 2 hours. The bonded two wafers were fixed by a vacuum chuck and applied with torsion and shearing forces in the horizontal direction relative to the main surface of the wafers. Then, the two substrates were completely separated at a position corresponding to the projection range of the helium ion implantation. The separated surfaces were observed in detail using an optical microscope, but exposed portions of the initial bonded interface were not found.

On the other hand, when the pressure was further applied to the substrate (not subjected to the helium ion implantation), the vacuum chuck was detached and the substrate could not be put into the subsequent process.

Thereafter, the porous Si layer remaining on the support substrate side was agitated in a mixed solution (1:2) of 49% hydrofluoric acid and 30% aqueous hydrogen peroxide for selective etching. Single-crystal Si remained without being etched so that porous Si was selectively etched using single-crystal Si as an etching stopper and fully removed.

The etching speed of non-porous single-crystal Si relative to the etching liquid is extremely low so that the selection ratio relative to the etching speed of the porous layer reaches as much as no less than $10^5$ and the etching amount (about several tens of angstroms) at the non-porous layer can be ignored from a practical point of view.

Specifically, the single-crystal Si layer 0.1 μm thick was formed on the Si oxidized film. Thicknesses of the formed single-crystal Si layer were measured at 100 points thereover. Uniformity of the thicknesses was 101 nm±3 nm with the hydrogen ion implantation, while it was 101 nm±7 nm without the hydrogen ion implantation so that it was confirmed that the thickness distribution deteriorated due to influence of dispersion of thicknesses of porous silicon.

Thereafter, heat treatment was performed at 1,100° C. in a hydrogen atmosphere for 1 hour.

When evaluating the surface roughness using an interatomic force microscope, the mean square roughness of 50 μm square region was about 0.2 nm which was equal to the silicon wafer on the market.

As the result of section observation by a transmission electron microscope, it was confirmed that no new crystal defects were introduced into the Si layer and excellent crystalline properties were maintained.

Similar results were obtained even without forming the oxidized film on the surface of the epitaxial Si layer.

At the same time, the porous Si layer remaining on the Si substrate side was also agitated in a mixed solution (1:2) of 49% hydrofluoric acid and aqueous 30% hydrogen peroxide for selective etching. Single-crystal Si remained without being etched so that porous Si was selectively etched using single-crystal Si as an etching stopper and fully removed, and the Si substrate could be again put into the porous-forming process.

EXAMPLE 10

Two first p- or n-type (100) single-crystal Si substrates each being 625 μm thick, 0.01 Ω·cm in resistivity and 5 inches in diameter were prepared and anodized in an HF solution.

The anodization conditions were as follows:
Current Density: 5 (mA·cm$^{-2}$)
Anodization Solution: HF:H$_2$O:C$_2$H$_5$OH=1:1:1
Time: 12 (minutes)
Thickness of Porous Si: 10 ($\mu$m)
Porosity: 15 (%)

The substrates were oxidized at 400° C. in the oxygen atmosphere for 1 hour. Through the oxidation, the pore inner walls of porous Si were coated with thermally oxidized films. Using the CVD (chemical vapor deposition) method, single-crystal Si was epitaxially grown by 0.55 $\mu$m on porous Si. The growing conditions was as follows. The accuracy of the film thickness was ±2%.

Source Gas: SiH$_2$Cl$_2$/H$_2$
Gas Flow Rate: 0.5/180 1/min
Gas Pressure: 80 Torr
Temperature: 900° C.
Growing Speed: 0.3 $\mu$m/min Further, an SiO$_2$ layer of 100 nm was formed on the surface of each epitaxial Si layer through thermal oxidation.

Subsequently, hydrogen ions of 1×10$^{18}$/cm$^2$ were implanted into the porous side of only one of the substrates at an acceleration voltage of 100 keV.

The surface of the SiO$_2$ layer and the surface of a separately prepared support quartz substrate were exposed to oxygen plasma, respectively, then overlapped and abutted with each other, and subjected to the heat treatment at 200° C. for 2 hours to increase the bonding strength. Then, the porous Si layer was divided into two at the ion-implanted region.

On the other hand, no change was observed at the substrate which was not subjected to the helium ion implantation.

Thereafter, the porous Si layer remaining on the support substrate side was agitated in a mixed solution (1:2) of 49% hydrofluoric acid and aqueous 30% hydrogen peroxide for selective etching. Single-crystal Si remained without being etched so that porous Si was selectively etched using single-crystal Si as an etching stopper and fully removed.

The etching speed of non-porous single-crystal Si relative to the etching liquid is extremely low so that the selection ratio relative to the etching speed of the porous layer reaches no less than 10$^5$ and the etching amount (about several tens of angstroms) at the non-porous layer can be ignored from a practical point of view.

Specifically, the single-crystal Si layer 0.5 $\mu$m thick was formed on the quartz substrate. Thicknesses of the formed single-crystal Si layer were measured at 100 points thereover. Uniformity of the thicknesses was 501 nm±11 nm with the hydrogen ion implantation. Thereafter, the heat treatment was performed at 1,100° C. in the hydrogen atmosphere for 1 hour.

When evaluating the surface roughness using an interatomic force microscope, the mean square roughness at a 50 $\mu$m square region was about 0.2 nm which was equal to the silicon wafer on the market.

As a result of section observation by a transmission electron microscope, it was confirmed that no new crystal defects were introduced into the Si layer and excellent crystallinity was maintained.

Similar results were obtained even without forming the oxidized film on the surface of the epitaxial Si layer.

EXAMPLE 11

A first p- or n-type, (100) single-crystal Si substrate being 625 $\mu$m thick, 0.01 Ω·cm in resistivity and 5 inches in diameter was prepared and anodized in an HF solution.

The anodization conditions were as follows:
Current Density: 5 (mA·cm$^{-2}$)
Anodization Solution: HF:H$_2$O:C$_2$H$_5$OH=1:1:1
Time: 12 (minutes)
Thickness of Porous Si: 10 ($\mu$m)
Porosity: 15 (%)

The substrate was oxidized at 400° C. in the oxygen atmosphere for 1 hour. Through the oxidation, pore inner walls of porous Si were coated with thermally oxidized films. Using the MOCVD (metal organic chemical vapor deposition) method, single-crystal GaAs was epitaxially grown by 1Am on porous Si. The growing conditions were as follows.

Source Gas: TMG/AsH$_3$/H$_2$
Gas Pressure: 80 Torr
Temperature: 700° C.

Subsequently, helium ions of 1×10$^{18}$/cm$^2$ were implanted into the porous side of the substrate at an acceleration voltage of 100 keV.

The surface of the GaAs layer and the surface of a separately prepared support Si substrate were overlapped and abutted with each other, and subjected to the heat treatment at 200° C. for 2 hours so as to enhance the bonding strength. Then, the porous Si layer was divided into two at the ion-implanted region.

Thereafter, after removing the oxidized film on the inner walls of the porous Si layer using hydrofluoric acid, the porous Si was etched with a solution of ethylenediamine, pyro-catechol and water (ratio: 17 ml:3 g:8 ml) at 110° C. Single-crystal GaAs remained without being etched so that porous Si was selectively etched using single-crystal GaAs as an etching stopper and fully removed.

The etching speed of single-crystal GaAs relative to the etching liquid is extremely low so that the thickness reduction can be ignored from a practical point of view.

Specifically, the single-crystal GaAs layer having 1 $\mu$m in thickness was formed on the Si substrate. No change was caused on the single-crystal GaAs layer even by the selective etching of porous Si.

As a result of section observation by a transmission electron microscope, it was confirmed that no new crystal defects were introduced into the GaAs layer and excellent crystallinity was maintained.

By using the Si substrate with the oxidized film as the support substrate, GaAs on the insulating film could also be produced similarly.

EXAMPLE 12

A first p- or n-type, (100) single-crystal Si substrate being 625 $\mu$m thick, 0.01 Ω·cm in resistivity and 5 inches in diameter was prepared and anodized in an HF solution.

The anodization conditions were as follows:
Current Density: 10 (mA·cm$^{-2}$)
Anodization Solution: HF:H$_2$O:C$_2$H$_5$OH=1:1:1
Time: 24 (minutes)
Thickness of Porous Si: 20 ($\mu$m)
Porosity: 17 (%)

The substrate was oxidized at 400° C. in the oxygen atmosphere for 2 hours. Through the oxidation, the pore inner walls of porous Si were coated with thermally oxidized films. Using the MBE (molecular beam epitaxy) method, single-crystal AlGaAs was epitaxially grown by 0.5 $\mu$m on porous Si.

Subsequently, helium ions of 1×10$^{18}$/cm$^2$ were implanted into the porous side of the substrate at an acceleration voltage of 100 keV.

The surface of the AlGaAs layer and the surface of a separately prepared support substrate of low melting point glass were overlapped and abutted with each other, and subjected to the heat treatment at 500° C. for 2 hours. Through this heat treatment, the substrates were firmly bonded with each other.

When sufficient pressure was applied to the bonded wafers perpendicularly relative to the in-plane and uniformly over the in-plane, the porous Si layer was divided into two at the ion-implanted region.

Thereafter, porous Si was etched with a hydrofluoric acid solution. Single-crystal AlGaAs remained without being etched so that porous Si was selectively etched using single-crystal AlGaAs as an etching stopper and fully removed.

The etching speed of single-crystal AlGaAs relative to the etching liquid is extremely low so that the thickness reduction can be ignored from a practical point of view.

Specifically, the single-crystal AlGaAs layer 0.5 μm thick was formed on the glass substrate. No change was caused on the single-crystal AlGaAs layer even by the selective etching of porous Si.

As a result of section observation by a transmission electron microscope, it was confirmed that no new crystal defects were introduced into the AlGaAs layer and excellent crystallinity was maintained.

EXAMPLE 13

A first p- or n-type (100) single-crystal Si substrate with both sides polished and being 625 μm 0.01 Ω·cm in resistivity and 6 inches in diameter was prepared and anodized at both sides thereof in an HF solution.

The anodization conditions were as follows:

Current Density: 5 (mA·cm$^{-2}$)
Anodization Solution: HF:H$_2$O:C$_2$H$_5$OH=1:1:1
Time: 12×2 (minutes)
Thickness of Porous Si: 10 (μm) for each side
Porosity: 15 (%)

The substrate was oxidized at 400° C. in the oxygen atmosphere for 1 hour. Through the oxidation, the pore inner walls of porous Si were coated with thermally oxidized films. Using the CVD (chemical vapor deposition) method, single-crystal Si was epitaxially grown by 1 μm on porous Si formed at each side. The growing conditions were as follows.

Source Gas: SiH$_2$Cl$_2$/H$_2$
Gas Flow Rate: 0.5/180 1/min
Gas Pressure: 80 Torr
Temperature: 950° C.
Growing Speed: 0.3 μm/min Further, an SiO$_2$ layer of 100 nm was formed on the surface of each epitaxial Si layer through thermal oxidation.

Subsequently, hydrogen ions of 1×10$^{18}$/cm$^2$ were implanted into the porous layers at an acceleration voltage of 100 keV.

The surfaces of the SiO$_2$ layers and the surfaces of separately prepared two support Si substrates each formed with an SiO$_2$ layer of 500 nm were overlapped and abutted with each other, and subjected to heat treatment at 600° C. for 2 hours to achieve bonding. Then, the porous Si layer was divided into two at the ion-implanted region.

Thereafter, the porous Si layer was agitated in a mixed solution (1:5) of 49% hydrofluoric acid and 30% aqueous hydrogen peroxide for selective etching. Single-crystal Si remained without being etched so that porous Si was selectively etched using single-crystal Si as an etching stopper and fully removed.

The etching speed of non-porous single-crystal Si relative to the etching liquid is extremely low so that the selection ratio relative to the etching speed of the porous layer reaches no less than 10$^5$ and the etching amount (about several tens of angstroms) at the non-porous layer can be ignored from a practical point of view.

Specifically the two single-crystal Si layers each 1 μm thick were simultaneously formed on the Si oxidized films. No change was caused on the single-crystal Si layers even by the selective etching of porous Si.

As a result of section observation by a transmission electron microscope, it was confirmed that no new crystal defects were introduced into the Si layer and excellent crystallinity was maintained.

Similar results were obtained even without forming the oxidized film on the surface of the epitaxial Si layer.

EXAMPLE 14

Two first p- or n-type (100) single-crystal Si substrates each 625 μm thick, 0.01 Ω·cm in resistivity and 5 inches in diameter were prepared and anodized in an HF solution.

The anodization conditions were as follows:

Current Density: 5 (mA·cm$^{-2}$)
Anodization Solution: HF:H$_2$O:C$_2$H$_5$OH=1:1:1
Time: 12 (minutes)
Thickness of Porous Si: 10 (μm)
Porosity: 15 (%)

The substrates were oxidized at 400° C. in the oxygen atmosphere for 1 hour. Through the oxidation, the pore inner walls of porous Si were coated with oxidized films. Using the CVD (chemical vapor deposition) method, single-crystal Si was grown by 0.55 μm on porous Si. The growing conditions were as follows. The accuracy of the film thickness was ±2%.

Source Gas: SiH$_2$Cl$_2$/H$_2$
Gas Flow Rate: 0.5/180 1/min
Pressure: 80 Torr
Temperature: 900° C.
Growing Speed: 0.3 μm/min Further, an SiO$_2$ layer of 100 nm was formed on the surface of each epitaxial Si layer through thermal oxidation.

Subsequently, hydrogen ions of 1×10$^{18}$/cm$^2$ were implanted into the porous side of only one of the substrates at an acceleration voltage of 100 keV.

The surface of the SiO$_2$ layer and the surface of a separately prepared support quartz substrate were exposed to oxygen plasma, respectively, then overlapped and abutted with each other, and subjected to the heat treatment at 200° C. for 2 hours so as to increase the bonding strength. Subsequently, the wave energy such as the ultrasonic wave was applied to the substrates. Then, the porous Si layer was divided into two at the ion-implanted region.

On the other hand, no change was observed at the substrate which was not subjected to the hydrogen ion implantation.

Thereafter, the porous Si layer remaining on the support substrate side was agitated in a mixed solution (1:2) of 49% hydrofluoric acid and 30% aqueous hydrogen peroxide for selective etching. Single-crystal Si remained without being etched so that porous Si was selectively etched using single-crystal Si as an etching stopper and fully removed.

The etching speed of non-porous single-crystal Si relative to the etching liquid is extremely low so that the selection ratio relative to the etching speed of the porous layer reaches no less than $10^5$ and the etching amount (about several tens of angstroms) at the non-porous layer can be ignored from a practical point of view.

Specifically, the single-crystal Si layer 0.5 μm thick was formed on the quartz substrate. Thicknesses of the formed single-crystal Si layer were measured at 100 points thereover. Uniformity of the thicknesses was 501 nm±11 nm with the hydrogen ion implantation. Thereafter the heat treatment was performed at 1,100° C. in a hydrogen atmosphere for 1 hour.

When evaluating the surface roughness using an interatomic force microscope, the mean square roughness at a 50 μm square region was about 0.2 nm which was equal to the silicon wafer on the market.

As a result of section observation by a transmission electron microscope, it was confirmed that no new crystal defects were introduced into the Si layer and the excellent crystallinity was maintained.

Similar results were obtained even without forming the oxidized film on the surface of the epitaxial Si layer;

The single-crystal Si substrate was reused as a single-crystal Si substrate after removing remaining porous Si and performing surface-polishing to provide a mirror finished surface.

What is claimed is:

1. A semiconductor article having
a nonporous semiconductor substrate, first, second and third porous semiconductor layers formed on the nonporous semiconductor substrate, and a nonporous semiconductor layer formed on the first porous semiconductor layer, wherein the second porous semiconductor layer has a density lower than those of the first and third semiconductor layers, the first, second and third porous layers all have a density lower than the semiconductor substrate and the semiconductor layer, and the nonporous semiconductor layer is capable of being separated from the nonporous semiconductor substrate.

2. The semiconductor article according to claim 1, wherein said semiconductor layer is a nonporous single-crystal layer.

3. The semiconductor article according to claim 1, wherein said porous layer is formed by anodization.

4. The semiconductor article according to claim 3, wherein said porous layer is formed by varying current density.

5. The semiconductor article according to claim 1, wherein said second porous semiconductor layer is capable of generating a crack in itself in preference to other portions to separate said nonporous semiconductor layer from said semiconductor substrate.

* * * * *

UNITED STATES PATENT AND TRADEMARK OFFICE
CERTIFICATE OF CORRECTION

PATENT NO. : 6,246,068 B1
DATED : June 12, 2001
INVENTOR(S) : Nobuhiko Sato et al.

Page 1 of 1

It is certified that error appears in the above-identified patent and that said Letters Patent is hereby corrected as shown below:

<u>Title page,</u>
Item [56], References Cited, under FOREIGN PATENT DOCUMENTS:
"62108539A" should read -- 62-108539A --;
"03070156A" should read -- 3-070156A --;
"5211128" should read -- 5-211128 --;
"07079016" should read -- 7-079016 --;
"07211602B1" should read -- 7-211602B1 --;
"07302889" should read -- 7-302889 --; and
"9545441" should read -- 7-545441 --.

<u>Column 6,</u>
Line 54, "met hod" should -- method --.

<u>Column 8,</u>
Line 1, "form" should read -- from --; and
Line 55, "it is not only serve" should read -- it not only serves --.

<u>Column 29,</u>
Line 54, "50.1 nm±11nm" should read -- 501 nm±11 nm --.

<u>Column 30,</u>
Line 35, "grown" should be deleted.

<u>Column 34,</u>
Line 13, "follows." should read -- follows: --; and
Line 29, "pyro-catechol" should read -- pyrocatechol --.

Signed and Sealed this

Twenty-sixth Day of March, 2002

*Attest:*

*Attesting Officer*

JAMES E. ROGAN
*Director of the United States Patent and Trademark Office*